US012615861B2

(12) United States Patent
Huang et al.

(10) Patent No.: US 12,615,861 B2
(45) Date of Patent: *Apr. 28, 2026

(54) IMAGE SENSOR WITH A HIGH ABSORPTION LAYER

(71) Applicant: Taiwan Semiconductor Manufacturing Company, Ltd., Hsin-Chu (TW)

(72) Inventors: Chien-Chang Huang, Tainan (TW); Chien Nan Tu, Kaohsiung City (TW); Ming-Chi Wu, Kaohsiung City (TW); Yu-Lung Yeh, Kaohsiung City (TW); Ji Heng Jiang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 217 days.

This patent is subject to a terminal disclaimer.

(21) Appl. No.: 18/364,662

(22) Filed: Aug. 3, 2023

(65) Prior Publication Data

US 2023/0387150 A1    Nov. 30, 2023

Related U.S. Application Data

(60) Continuation of application No. 17/106,350, filed on Nov. 30, 2020, now Pat. No. 11,830,892, which is a
(Continued)

(51) Int. Cl.
H10F 39/00 (2025.01)
H10F 30/22 (2025.01)
(Continued)

(52) U.S. Cl.
CPC ......... H10F 39/8033 (2025.01); H10F 30/22 (2025.01); H10F 39/014 (2025.01);
(Continued)

(58) Field of Classification Search
CPC ........ H10F 39/12; H10F 39/80; H10F 39/802; H10F 39/8023; H10F 39/8027;
(Continued)

(56) References Cited

U.S. PATENT DOCUMENTS 5,744,827 A     4/1998  Jeong et al.
7,759,755 B2    7/2010  Adkisson et al.
(Continued)

FOREIGN PATENT DOCUMENTS

JP       2013183073 A    9/2013
KR        100749263 A    8/2007
WO       2016024946 A1   2/2016

OTHER PUBLICATIONS

Heiman, D. "Photoluminescence Spectroscopy." Physics U600, Adv Lab I—Physics of Waves and Optics—Summer 2004, Northeastern University, Jun. 1, 2004.
(Continued)

*Primary Examiner* — William B Partridge
*Assistant Examiner* — Gustavo G Ramallo
(74) *Attorney, Agent, or Firm* — Eschweiler & Potashnik, LLC

(57) ABSTRACT

An image sensor with high quantum efficiency is provided. In some embodiments, a semiconductor substrate includes a non-porous semiconductor layer along a front side of the semiconductor substrate. A periodic structure is along a back side of the semiconductor substrate. A high absorption layer lines the periodic structure on the back side of the semiconductor substrate. The high absorption layer is a semiconductor material with an energy bandgap less than that of the non-porous semiconductor layer. A photodetector is in the semiconductor substrate and the high absorption layer. A method for manufacturing the image sensor is also provided.

20 Claims, 15 Drawing Sheets

Related U.S. Application Data continuation of application No. 16/541,499, filed on Aug. 15, 2019, now Pat. No. 10,868,053, which is a continuation of application No. 16/127,322, filed on Sep. 11, 2018, now Pat. No. 10,553,628, which is a division of application No. 15/609,325, filed on May 31, 2017, now Pat. No. 10,438,980.

(51) Int. Cl.

| | |
|---|---|
| *H10F 39/12* | (2025.01) |
| *H10F 39/18* | (2025.01) |
| *H10F 77/122* | (2025.01) |
| *H10F 77/14* | (2025.01) |
| *H10F 77/70* | (2025.01) |

(52) U.S. Cl.
CPC ......... *H10F 39/182* (2025.01); *H10F 39/199* (2025.01); *H10F 39/8027* (2025.01); *H10F 39/812* (2025.01); *H10F 77/1228* (2025.01); *H10F 77/148* (2025.01); *H10F 77/703* (2025.01); *H10F 39/8053* (2025.01); *H10F 39/8063* (2025.01)

(58) Field of Classification Search
CPC ............... H10F 39/803; H10F 39/8033; H10F 39/8037; H10F 39/80373; H10F 39/80377; H10F 39/804; H10F 39/805; H10F 39/8053; H10F 39/8057; H10F 39/806; H10F 39/8063; H10F 39/8067; H10F 39/807; H10F 39/026; H10F 39/809; H10F 39/811; H10F 39/812; H10F 39/199; H10F 39/813; H10F 39/18; H10F 39/182; H10F 39/1825; H10F 39/184; H10F 39/1843; H10F 39/1847; H10F 39/186; H10F 39/1892; H10F 39/1898; H10F 39/191; H10F 39/192; H10F 39/193; H10F 39/1935; H10F 39/194; H10F 39/1945; H10F 39/198; H10F 39/196; H10F 39/197; H10F 39/011; H10F 39/024; H10F 39/014; H10F 39/018; H10F 39/016; H10F 39/021; H10F 39/022; H10F 39/028
See application file for complete search history.

(56) References Cited

U.S. PATENT DOCUMENTS

| | | | |
|---|---|---|---|
| 7,880,207 B2 | 2/2011 | Fertig et al. | |
| 10,157,944 B2 | 12/2018 | Huang et al. | |
| 10,163,974 B2 | 12/2018 | Su | |
| 10,304,898 B2 | 5/2019 | Su et al. | |
| 10,438,980 B2 * | 10/2019 | Huang | H10F 39/812 |
| 10,868,053 B2 | 12/2020 | Huang et al. | |
| 2001/0005018 A1 | 6/2001 | Oh | |
| 2002/0024058 A1 | 2/2002 | Marshall | |
| 2004/0161865 A1 | 8/2004 | Yu | |
| 2005/0133723 A1 | 6/2005 | Lee | |
| 2007/0072409 A1 | 3/2007 | Ulmer | |
| 2008/0164606 A1 | 7/2008 | Greisen et al. | |
| 2009/0008735 A1 | 1/2009 | Ogino et al. | |
| 2009/0014751 A1 | 1/2009 | Kim et al. | |
| 2009/0261445 A1 | 10/2009 | Sugino | |
| 2010/0001405 A1 | 1/2010 | Williamson et al. | |
| 2010/0038801 A1 | 2/2010 | Gu et al. | |
| 2010/0267184 A1 | 10/2010 | Noh | |
| 2010/0302424 A1 | 12/2010 | Yamaguchi | |
| 2011/0001038 A1 | 1/2011 | Tseng et al. | |
| 2011/0012222 A1 * | 1/2011 | Cho | H10F 71/121 257/E31.043 |
| 2011/0089517 A1 | 4/2011 | Venezia | |

| | | | |
|---|---|---|---|
| 2011/0240997 A1 * | 10/2011 | Rockenberger | H01L 21/0237 257/E21.09 |
| 2012/0003787 A1 | 1/2012 | Tanaka et al. | |
| 2012/0068355 A1 | 3/2012 | Aoki et al. | |
| 2012/0273907 A1 | 11/2012 | Lim | |
| 2012/0326248 A1 | 12/2012 | Daneman et al. | |
| 2013/0027073 A1 | 1/2013 | Pagani et al. | |
| 2013/0030846 A1 | 1/2013 | Nesgos | |
| 2013/0052760 A1 | 2/2013 | Cho | |
| 2013/0341746 A1 | 12/2013 | Ting et al. | |
| 2014/0020752 A1 * | 1/2014 | Arimoto | H10F 77/703 438/96 |
| 2014/0177081 A1 | 6/2014 | Sugishima et al. | |
| 2014/0253768 A1 | 9/2014 | Li | |
| 2014/0353828 A1 | 12/2014 | Edelstein et al. | |
| 2015/0028493 A1 | 1/2015 | Nakamura et al. | |
| 2015/0279885 A1 | 10/2015 | Tu et al. | |
| 2015/0287761 A1 * | 10/2015 | Huang | H10F 39/028 257/432 |
| 2016/0181104 A1 | 6/2016 | Schmidt | |
| 2016/0181228 A1 | 6/2016 | Higuchi et al. | |
| 2016/0343532 A1 * | 11/2016 | Chuang | H01J 1/308 |
| 2017/0110493 A1 * | 4/2017 | Yokogawa | H10F 39/8033 |
| 2017/0278881 A1 | 9/2017 | Hsu et al. | |
| 2017/0288070 A1 | 10/2017 | Tracy et al. | |
| 2018/0337211 A1 | 11/2018 | Su et al. | |
| 2018/0350853 A1 | 12/2018 | Huang et al. | |

OTHER PUBLICATIONS

Cressler, et al. "SiGe HBT Technology: A New Contender for Si-Based RF and Microwave Circuit Applications." IEEE Transactions on Microwave Theory and Techniques, vol. 46, No. 5, May 1998.

Zimmermann, H. "Integrated Silicon Optoelectronics." Chapter 1—Basics of Optical Emission and Absorption. 2010, XX, 386 p. 321 illus., 6 illus. in color., Hardcover. ISBN: 978-3-642-01520-5.

Xu, et al. "Electronic Band Structure and Optical Properties of Silicon Nanoporous Pillar Array." Physica E41(2009) 1882-1885, published Aug. 25, 2009.

Li, et al. "Broadband Infrared Photoluminescence in Silicon Nanowires with High Density Stacking Faults." Nanoscale, 2015, 7, 1601.

Wilamowski, et al. "Fundamentals of Industrial Electronics." Chapter 9—Bipolar Junction Transistor. Published Mar. 4, 2011. ISBN 9781439802793.

Sun, et al. "Delay Time Constant Analysis for Ft Optimization in RF Si/SiGe Bipolar Devices." IEEE article. ISBN 0-7803-7749-4, published in 2003.

Tubert, et al. "High Speed Dual Port Pinned-photodiode for Time-Of-Flight Imaging." 2009 International Image Sensor Workshop, Bergen, Norway, Jun. 22-28, 2009.

Watts, Anthony. A Window on Water Vapor and Planetary Temperature. Published on Jun. 18, 2008. Retrieved from https://wattsupwiththat.com/2008/06/18/a-window-on-water-vapor-and-planetary-temperature/ on May 15, 2017.

Kaufmann, et al. "Near Infrared Image Sensor with Integrated Germanium Photodiodes." Journal of Applied Physics • Jul. 2011.

Bob, et al. "Fabrication and Subband Gap Optical Properties of Silicon Supersaturated with Chalcogens by Ion Implantation and Pulsed Laser Melting." Journal of Applied Physics 107, 123506 (2010).

Liu, Jia-Ming. "Photonic Devices." Chapter 14—Lecture 12: Photodiode Detectors. Published online Jan. 2010, ISBN # 9780511614255.

Mayonado, et al. "Investigation of the Bragg-Snell Law in Photonic Crystals." 2015 BFY Proceedings. Edited by Eblen-Zayas, Behringer, and Kozminski; Peer-reviewed, doi:10.1119/bfy.2015.pr.015.

Wang, et al. "Light Trapping in Photonic Crystals." Energy Environ. Sci., 2014, 7, 2725-2738.

Gong, et al. "Photonic Crystals: Principals and Applications." Published Dec. 10, 2013. International Standard Book No.—13: 978-981-4364-83-6 (eBook—PDF).

U.S. Appl. No. 15/449,284, filed Mar. 3, 2017.

U.S. Appl. No. 15/597,452, filed May 17, 2017.

(56)        References Cited

OTHER PUBLICATIONS

Non-Final Office Action dated Oct. 23, 2017 in connection with U.S. Appl. No. 15/449,284.

Notice of Allowance dated Mar. 30, 2018 in connection with U.S. Appl. No. 15/449,284.

Non-Final Office Action dated Apr. 13, 2018 in connection with U.S. Appl. No. 15/597,452.

Non-Final Office Action dated Apr. 6, 2018 for U.S. Appl. No. 15/609,325.

Notice of Allowance dated Sep. 7, 2018 in connection with U.S. Appl. No. 15/597,452.

Non-Final Office Action dated Oct. 18, 2018 in connection with related U.S. Appl. No. 15/665,495.

Final Office Action dated Mar. 7, 2019 in connection with U.S. Appl. No. 15/665,495.

Notice of Allowance dated Apr. 4, 2019 in connection with U.S. Appl. No. 16/190,608.

Non Final Office Action dated Aug. 13, 2019 for U.S. Appl. No. 16/127,322.

Yokogawa et al. "IR Sensitivity Enhancement of CMOS Image Sensor With Diffractive Light Trapping Pixels." Scientific Reports 7, Article No. 3832 (2017), published on Jun. 19, 2017.

Non Final Office Action dated Sep. 26, 2019 for U.S. Appl. No. 16/420,576.

Notice of Allowance dated Oct. 29, 2019 for U.S. Appl. No. 16/420,576.

Notice of Allowance dated Nov. 29, 2019 for U.S. Appl. No. 16/127,322.

Non Final Office Action dated Mar. 6, 2020 for U.S. Appl. No. 16/693,627.

Non Final Office Action dated Jun. 17, 2020 for U.S. Appl. No. 16/541,499.

Notice of Allowance dated Sep. 8, 2020 for U.S. Appl. No. 16/541,499.

Non-Final Office Action dated Mar. 30, 2023 for U.S. Appl. No. 17/106,350.

Notice of Allowance dated Jul. 25, 2023 for U.S. Appl. No. 17/106,350.

* cited by examiner

100

200A

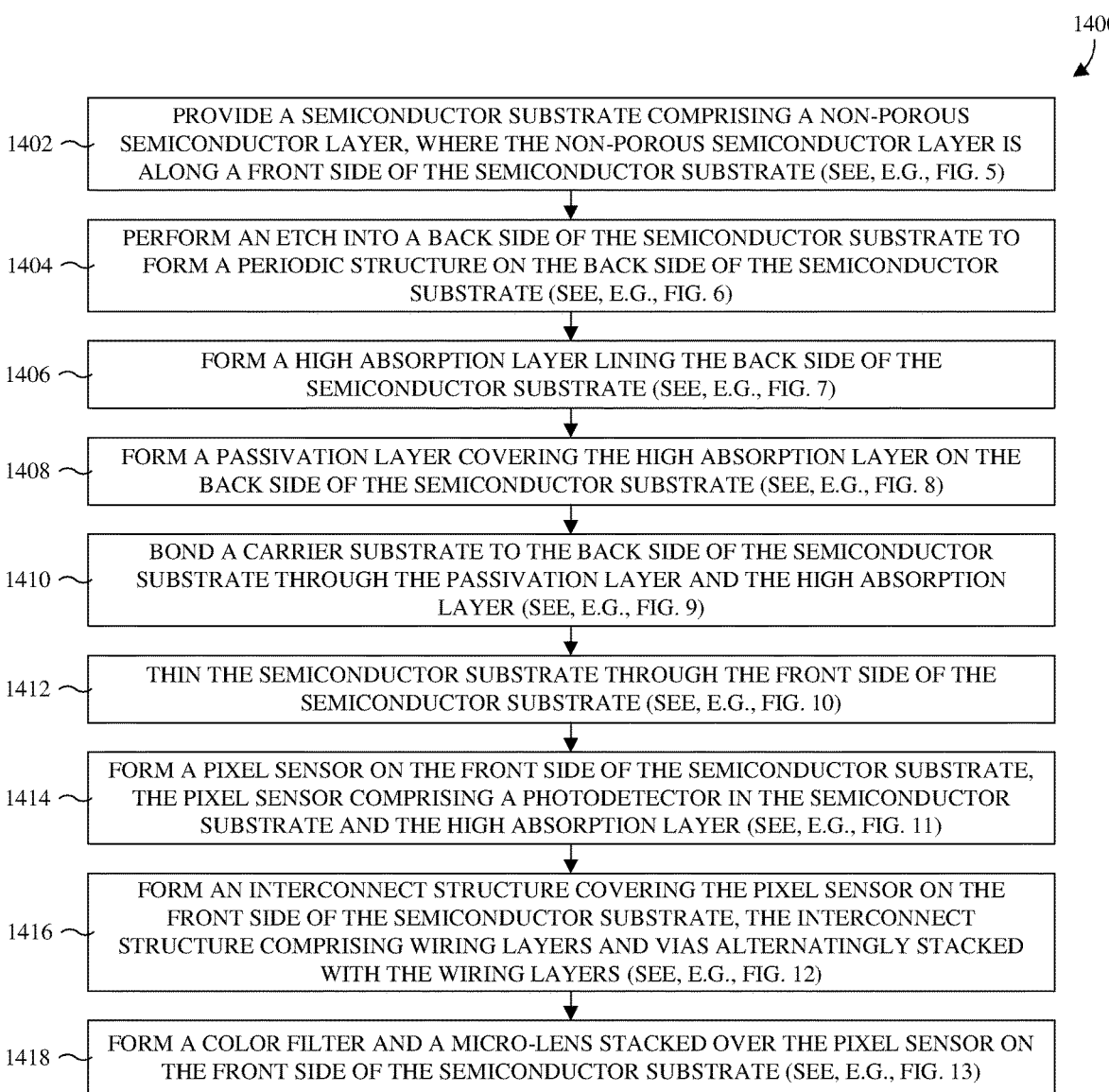

1400

1402 — PROVIDE A SEMICONDUCTOR SUBSTRATE COMPRISING A NON-POROUS SEMICONDUCTOR LAYER, WHERE THE NON-POROUS SEMICONDUCTOR LAYER IS ALONG A FRONT SIDE OF THE SEMICONDUCTOR SUBSTRATE (SEE, E.G., FIG. 5)

1404 — PERFORM AN ETCH INTO A BACK SIDE OF THE SEMICONDUCTOR SUBSTRATE TO FORM A PERIODIC STRUCTURE ON THE BACK SIDE OF THE SEMICONDUCTOR SUBSTRATE (SEE, E.G., FIG. 6)

1406 — FORM A HIGH ABSORPTION LAYER LINING THE BACK SIDE OF THE SEMICONDUCTOR SUBSTRATE (SEE, E.G., FIG. 7)

1408 — FORM A PASSIVATION LAYER COVERING THE HIGH ABSORPTION LAYER ON THE BACK SIDE OF THE SEMICONDUCTOR SUBSTRATE (SEE, E.G., FIG. 8)

1410 — BOND A CARRIER SUBSTRATE TO THE BACK SIDE OF THE SEMICONDUCTOR SUBSTRATE THROUGH THE PASSIVATION LAYER AND THE HIGH ABSORPTION LAYER (SEE, E.G., FIG. 9)

1412 — THIN THE SEMICONDUCTOR SUBSTRATE THROUGH THE FRONT SIDE OF THE SEMICONDUCTOR SUBSTRATE (SEE, E.G., FIG. 10)

1414 — FORM A PIXEL SENSOR ON THE FRONT SIDE OF THE SEMICONDUCTOR SUBSTRATE, THE PIXEL SENSOR COMPRISING A PHOTODETECTOR IN THE SEMICONDUCTOR SUBSTRATE AND THE HIGH ABSORPTION LAYER (SEE, E.G., FIG. 11)

1416 — FORM AN INTERCONNECT STRUCTURE COVERING THE PIXEL SENSOR ON THE FRONT SIDE OF THE SEMICONDUCTOR SUBSTRATE, THE INTERCONNECT STRUCTURE COMPRISING WIRING LAYERS AND VIAS ALTERNATINGLY STACKED WITH THE WIRING LAYERS (SEE, E.G., FIG. 12)

1418 — FORM A COLOR FILTER AND A MICRO-LENS STACKED OVER THE PIXEL SENSOR ON THE FRONT SIDE OF THE SEMICONDUCTOR SUBSTRATE (SEE, E.G., FIG. 13)

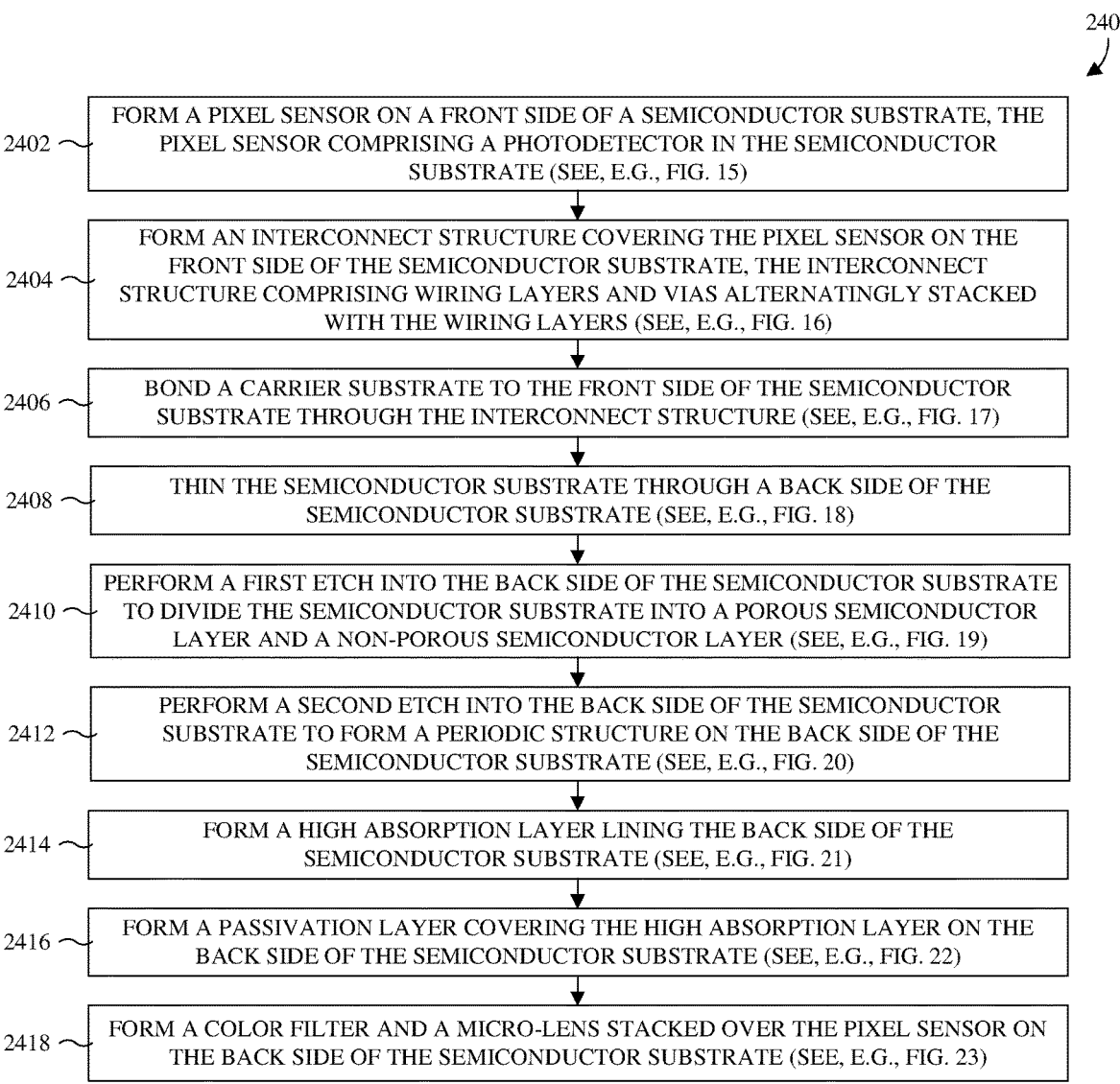

2402 — FORM A PIXEL SENSOR ON A FRONT SIDE OF A SEMICONDUCTOR SUBSTRATE, THE PIXEL SENSOR COMPRISING A PHOTODETECTOR IN THE SEMICONDUCTOR SUBSTRATE (SEE, E.G., FIG. 15)

2404 — FORM AN INTERCONNECT STRUCTURE COVERING THE PIXEL SENSOR ON THE FRONT SIDE OF THE SEMICONDUCTOR SUBSTRATE, THE INTERCONNECT STRUCTURE COMPRISING WIRING LAYERS AND VIAS ALTERNATINGLY STACKED WITH THE WIRING LAYERS (SEE, E.G., FIG. 16)

2406 — BOND A CARRIER SUBSTRATE TO THE FRONT SIDE OF THE SEMICONDUCTOR SUBSTRATE THROUGH THE INTERCONNECT STRUCTURE (SEE, E.G., FIG. 17)

2408 — THIN THE SEMICONDUCTOR SUBSTRATE THROUGH A BACK SIDE OF THE SEMICONDUCTOR SUBSTRATE (SEE, E.G., FIG. 18)

2410 — PERFORM A FIRST ETCH INTO THE BACK SIDE OF THE SEMICONDUCTOR SUBSTRATE TO DIVIDE THE SEMICONDUCTOR SUBSTRATE INTO A POROUS SEMICONDUCTOR LAYER AND A NON-POROUS SEMICONDUCTOR LAYER (SEE, E.G., FIG. 19)

2412 — PERFORM A SECOND ETCH INTO THE BACK SIDE OF THE SEMICONDUCTOR SUBSTRATE TO FORM A PERIODIC STRUCTURE ON THE BACK SIDE OF THE SEMICONDUCTOR SUBSTRATE (SEE, E.G., FIG. 20)

2414 — FORM A HIGH ABSORPTION LAYER LINING THE BACK SIDE OF THE SEMICONDUCTOR SUBSTRATE (SEE, E.G., FIG. 21)

2416 — FORM A PASSIVATION LAYER COVERING THE HIGH ABSORPTION LAYER ON THE BACK SIDE OF THE SEMICONDUCTOR SUBSTRATE (SEE, E.G., FIG. 22)

2418 — FORM A COLOR FILTER AND A MICRO-LENS STACKED OVER THE PIXEL SENSOR ON THE BACK SIDE OF THE SEMICONDUCTOR SUBSTRATE (SEE, E.G., FIG. 23)

Fig. 24

IMAGE SENSOR WITH A HIGH ABSORPTION LAYER

REFERENCE TO RELATED APPLICATIONS

This application is a Continuation of U.S. application Ser. No. 17/106,350, filed on Nov. 30, 2020, which is a Continuation of U.S. application Ser. No. 16/541,499, filed on Aug. 15, 2019 (now U.S. Pat. No. 10,868,053, issued on Dec. 15, 2020), which is a Continuation of U.S. application Ser. No. 16/127,322, filed on Sep. 11, 2018 (now U.S. Pat. No. 10,553,628, issued on Feb. 4, 2020), which is a Divisional of U.S. application Ser. No. 15/609,325, filed on May 31, 2017 (now U.S. Pat. No. 10,438,980, issued on Oct. 8, 2019). The contents of the above-referenced Patent Applications are hereby incorporated by reference in their entirety.

BACKGROUND

Integrated circuits (ICs) with image sensors are used in a wide range of modern day electronic devices, such as, for example, cameras and cell phones. In recent years, complementary metal-oxide semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 illustrates a flowchart of some embodiments of the method of FIGS. 5-13.

FIG. 24 illustrates a flowchart of some embodiments of the method of FIGS. 15-23.

DETAILED DESCRIPTION

Figure 1:
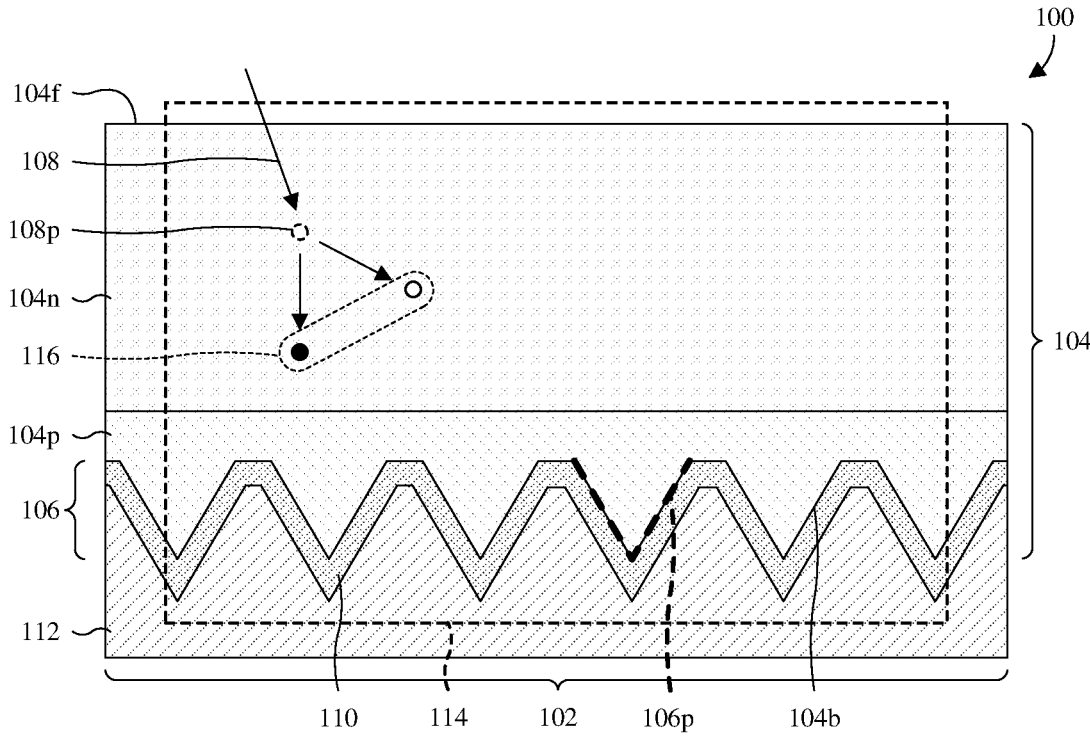
FIG. 1 illustrates a cross-sectional view of some embodiments of an image sensor with a high absorption pixel sensor.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an etch, a dielectric layer, or a substrate) may be referred to as a "first" element in some embodiments, the element may be referred to as a "second" element in other embodiments.

Some complementary metal-oxide-semiconductor (CMOS) image sensors comprise a semiconductor substrate of monocrystalline silicon and an array of pixel sensors arranged in the semiconductor substrate. The pixel sensors comprise respective photodetectors buried in the semiconductor substrate and respective pixel transistors arranged on a surface of the semiconductor substrate. The photodetectors are configured to absorb incident radiation and to generate an electric signal corresponding to the incident radiation.

A challenge with the CMOS image sensors is that monocrystalline silicon has a large energy bandgap, and hence a low absorption coefficient for high wavelength radiation. The high wavelength radiation includes, for example, radiation with a wavelength greater than about 800 micrometers, such as infrared radiation. Therefore, the photodetectors have poor quantum efficiency for high wavelength radiation unless enhanced. Quantum efficiency (QE) is the fraction of incident photons which contribute to the electric signal.

One approach for enhancing the CMOS image sensors is to increase the thickness of the semiconductor substrate and the depth to which the photodetectors extend into the semiconductor substrate. The higher the wavelength of incident radiation, the higher the absorption depth. However, this is difficult with existing CMOS processes and adds cost to the manufacture of the CMOS image sensors. Further, increasing the depth to which the photodetectors extend into the semiconductor substrate increases cross talk and die size.

In view of the foregoing, various embodiments of the present application are directed towards a high absorption image sensor. In some embodiments, a semiconductor substrate includes a non-porous semiconductor layer. The non-porous semiconductor layer is along a front side of the semiconductor substrate. A periodic structure is along a back side of the semiconductor substrate. The periodic structure includes a plurality of protrusions defined by the semiconductor substrate. A high absorption layer lines the periodic structure on the back side of the semiconductor substrate. The high absorption layer is a semiconductor material with an energy bandgap less than that of the non-porous semiconductor layer. A photodetector is in the semiconductor substrate and the high absorption layer.

Advantageously, by arranging the photodetector in the high absorption layer, the photodetector benefits from the low energy bandgap of the high absorption layer. Namely, the low energy bandgap renders the high absorption layer highly absorptive of incident radiation, such that the photodetector has high quantum efficiency. Further, the high quantum efficiency advantageously allows cost, die size, crosstalk, or a combination of the foregoing to be low when the high absorption image sensor is employed for sensing high wavelength radiation, such as infrared radiation, since high wavelength radiation may be sufficiently sensed without the semiconductor substrate having a large thickness.

With reference to FIG. 1, a cross-sectional view 100 of some embodiments of an image sensor with a high absorption pixel sensor 102 is provided. The image sensor may be, for example, front-side illuminated (FSI) or back-side illuminated (BSI). Further, the image sensor may be, for example, a CMOS image sensor, and/or an integrated circuit (IC) die or chip. As illustrated, a semiconductor substrate 104 comprises a non-porous semiconductor layer 104n and a porous semiconductor layer 104p. The non-porous semiconductor layer 104n is along a front-side surface 104f of the semiconductor substrate 104, and the porous semiconductor layer 104p is along a back-side surface 104b of the semiconductor substrate 104 that is opposite the front-side surface 104f of the semiconductor substrate 104. In alternative embodiments, the porous semiconductor layer 104p is omitted, such that the non-porous semiconductor layer 104n defines the back-side surface 104b of the semiconductor substrate 104.

The porous semiconductor layer 104p is a semiconductor material with a systematic structure of pores. The pores may be, for example, micrometer sized pores, nanometer sized pores, smaller sized pores, or a combination of the foregoing. The porous semiconductor layer 104p may be, for example, nanoporous silicon or some other type of porous semiconductor material. The non-porous semiconductor layer 104n is a semiconductor material without a systematic structure of pores, where the pores are sized as described above. For example, the non-porous semiconductor layer 104n may be a semiconductor material without a systematic structure of nanometer and/or micrometer sized pores. The non-porous semiconductor layer 104n may be, for example, monocrystalline silicon, polycrystalline silicon, or some other type of crystalline semiconductor material. Further, the non-porous semiconductor layer 104n may, for example, have an indirect energy bandgap.

In some embodiments, the semiconductor substrate 104 defines a periodic structure 106 along the back-side surface 104b of the semiconductor substrate 104. The periodic structure 106 may comprise, for example, a plurality of protrusions 106p in a periodic pattern or array along the back-side surface 104b of the semiconductor substrate 104.

For ease of illustration, only one of the protrusions 106p is labeled 106p. The protrusions 106p may, for example, have a cone shape, a pyramid shape, or some other shape.

Advantageously, the porous semiconductor layer 104p and/or the periodic structure 106 enhance absorption of radiation 108 (e.g., light) by the semiconductor substrate 104. For example, the porous semiconductor layer 104p may have a direct energy bandgap due to the periodic structure 106 and/or pores of the porous semiconductor layer 104p. The direct energy bandgap allows the porous semiconductor layer 104p to absorb photons 108p of the radiation 108 without dependence on phonons, such that absorption by the semiconductor substrate 104 may be enhanced. As another example, the protrusions 106p and/or the pores of the porous semiconductor layer 104p increase surface area, such that absorption by the semiconductor substrate 104 may be enhanced. As yet another example, the protrusions 106p and/or the pores of the porous semiconductor layer 104p reduce reflection of the radiation 108 off the semiconductor substrate 104, such that absorption by the semiconductor substrate 104 may be enhanced. Reflectance may, for example, be reduced since radiation 108 may enter the semiconductor substrate 104 through the pores of the porous semiconductor layer 104p and become trapped in the semiconductor substrate 104. Further, reflectance may, for example, be reduced since angled sidewalls of the protrusions 106p may reduce the likelihood of radiation reflecting away from the semiconductor substrate 104.

A high absorption layer 110 lines the back-side surface 104b of the semiconductor substrate 104, and is sandwiched between the semiconductor substrate 104 and a passivation layer 112. The high absorption layer 110 is a semiconductor material that has a low energy bandgap. The low energy bandgap may be, for example, an energy bandgap that is less than about 1 electron volt (eV). Further, the low energy bandgap may be, for example, an energy bandgap that is less than an energy bandgap of the non-porous semiconductor layer 104n and/or an energy bandgap of the porous semiconductor layer 104p. In some embodiments, the high absorption layer 110 is silicon germanium, or monocrystalline silicon doped with a chalcogen (e.g., sulfur, selenium, or tellurium). The passivation layer 112 may be, for example, silicon dioxide, silicon nitride, some other dielectric, or a combination of the foregoing.

A photodetector 114 is in the semiconductor substrate 104 and the high absorption layer 110, and is configured to absorb radiation 108 incident on the photodetector 114 to generate an electric signal. The electric signal may, for example, result from electron-hole pairs 116 generated in response to absorbing photons 108p of the radiation 108. The photodetector 114 may be, for example, a photodiode. Further, the photodetector 114 may, for example, comprise an n-type region (not shown) and a p-type region (not shown) that define a photo junction (e.g., a PN or PIN junction).

Advantageously, by arranging the photodetector 114 in the semiconductor substrate 104 and the high absorption layer 110, the photodetector 114 is highly absorptive of radiation 108, including infrared radiation (e.g., radiation with a wavelength greater than about 800 micrometers). Namely, the high absorption layer 110 has a low energy bandgap, and hence a high absorption coefficient, such that the high absorption layer 110, and hence the photodetector 114, are highly absorptive of radiation 108. As a result, the photodetector 114 advantageously has high quantum efficiency. Even more, quantum efficiency of the photodetector 114 is further enhanced by the porous semiconductor layer 104$p$ and/or the periodic structure 106, since the porous semiconductor layer 104$p$ and/or the periodic structure 106 enhance absorption of radiation 108 by the semiconductor substrate 104.

Figure 2A:
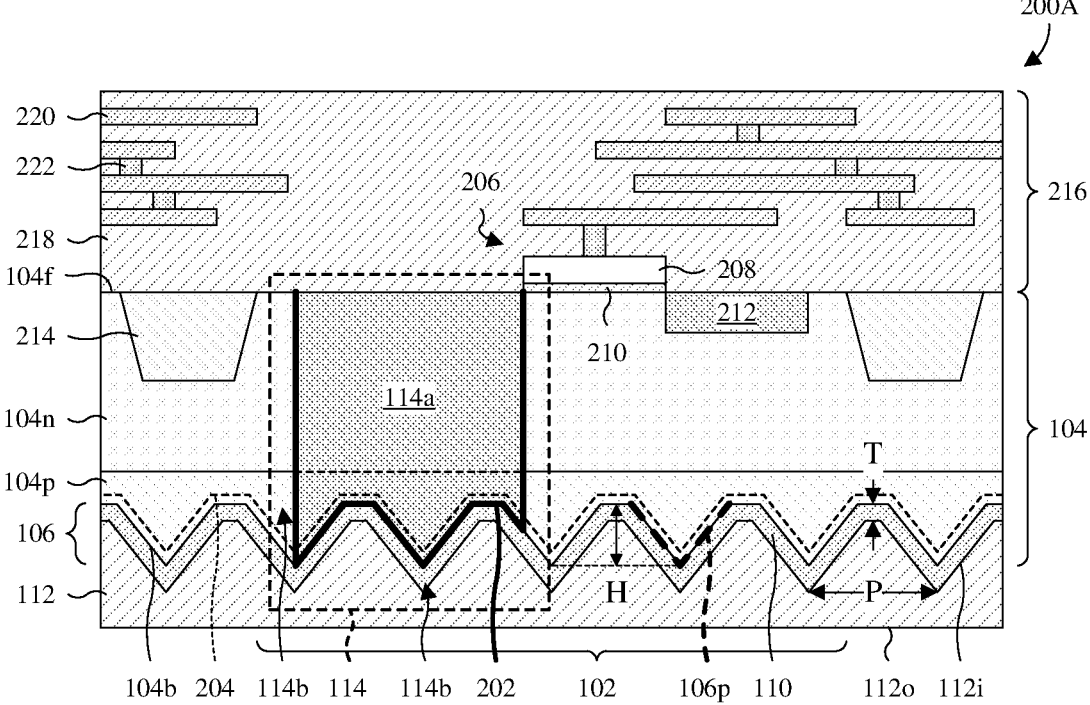
FIG. 2A illustrates a cross-sectional view of some more detailed embodiments of the image sensor of FIG. 1 with a porous semiconductor layer.

With reference to FIG. 2A, a cross-sectional view 200A of some more detailed embodiments of the image sensor of FIG. 1 is provided. As illustrated, a semiconductor substrate 104 comprises a non-porous semiconductor layer 104$n$ and a porous semiconductor layer 104$p$. The non-porous semiconductor layer 104$n$ is along a front-side surface 104$f$ of the semiconductor substrate 104, and the porous semiconductor layer 104$p$ is along a back-side surface 104$b$ of the semiconductor substrate 104 that is opposite the front-side surface 104$f$ of the semiconductor substrate 104.

In some embodiments, the semiconductor substrate 104 defines a periodic structure 106 along the back-side surface 104$b$ of the semiconductor substrate 104. The periodic structure 106 may comprise, for example, a plurality of protrusions 106$p$ in a periodic pattern or array along the back-side surface 104$b$. In some embodiments, pore size of the porous semiconductor layer 104$p$ increases or decreases gradually from tips of the protrusions 106$p$ to an interface between the non-porous semiconductor layer 104$n$ and the porous semiconductor layer 104$p$. For example, pore size may decrease gradually from an average size of about 40 nanometers at the tips to an average size of about 8 nanometers at the interface.

In some embodiments, the protrusions 106$p$ define a saw-toothed profile. In some embodiments, the protrusions 106$p$ have a pitch P of about 0.01-8.0 micrometers, about 0.2-5.0 micrometers, about 1.0-3.0 micrometers, or a combination of the foregoing. In some embodiments, the protrusions 106$p$ have a height H of about 0.2-20.0 micrometers, about 1.0-15.0 micrometers, about 5.0-10.0 micrometers, or a combination of the foregoing. In some embodiments, the protrusions 106$p$ have tapered sidewalls meeting at tips. For example, some or all of the protrusions 106$p$ may each be cone shaped or pyramid shaped (e.g., have an n-sided base, wherein n=3, 4, 5, 6, etc.). In other embodiments, the protrusions 106$p$ have another shape. For example, some or all of the protrusions may be cylinder shaped.

Advantageously, the porous semiconductor layer 104$p$ and/or the periodic structure 106 may enhance absorption of radiation by the semiconductor substrate 104. For example, the porous semiconductor layer 104$p$ may have a direct energy bandgap that enhances absorption. As another example, the porous semiconductor layer 104$p$ and/or the periodic structure 106 may increase surface area for enhanced absorption. As yet another example, the porous semiconductor layer 104$p$ may reduce reflection off the semiconductor substrate 104 for enhanced absorption.

A high absorption layer 110 lines the back-side surface 104$b$ of the semiconductor substrate 104, and is sandwiched between the semiconductor substrate 104 and a passivation layer 112. In some embodiments, the high absorption layer 110 conformally lines the back-side surface 104$b$ of the semiconductor substrate 104. The high absorption layer 110 is a semiconductor material that has a low energy bandgap. The low energy bandgap may be, for example, less than about 1.00 eV, 0.80 eV, 0.60 eV, or 0.40 eV. Further, the low energy bandgap may be, for example, less than an energy bandgap of the non-porous semiconductor layer 104$n$ and/or an energy bandgap of the porous semiconductor layer 104$p$. For example, the high absorption layer 110 may have an energy bandgap less than about 1.0 eV, whereas the non-porous semiconductor layer 104$n$ may have an energy bandgap greater than about 1.1 eV, 1.5 eV, 2.0 eV, or 5.0 eV.

In some embodiments, the high absorption layer 110 has a direct energy bandgap, such that absorption of incident radiation is advantageously not dependent on phonons. In some embodiments, the high absorption layer 110 has a thickness T of about 10-5000 angstroms, 100-4000 angstroms, 1000-3000 angstroms, or a combination of the foregoing. For example, the high absorption layer 110 may have a thickness T of about 500 angstroms or about 3000 angstroms. In some embodiments, the high absorption layer 110 is silicon germanium or monocrystalline silicon, and/or is doped with a chalcogen. For example, the high absorption layer 110 may be silicon germanium devoid of a chalcogen, or may be monocrystalline silicon doped with a chalcogen. As another example, the high absorption layer 110 may be $Si_{0.8}Ge_{0.2}$ with a thickness T of about 500 angstroms. In some embodiments where the high absorption layer 110 is doped with a chalcogen, the high absorption layer 110 is doped in excess of the solubility limit of the chalcogen (i.e., is supersaturated) to advantageously facilitate sub-band gap absorption of incident radiation (e.g., radiation with wavelengths of about 1.0-2.5 micrometers). The chalcogen may be, for example, sulfur (S), selenium (Se), tellurium (Te), or a combination of the foregoing. In some embodiments, the high absorption layer 110 interfaces with the semiconductor substrate 104 to define a heterojunction at the interface.

The passivation layer 112 underlies the high absorption layer 110 and may be, for example, silicon dioxide, silicon nitride, a high $\kappa$ dielectric, some other dielectric, or a combination of the foregoing. A high $\kappa$ dielectric is a dielectric with a dielectric constant $\kappa$ greater than about 3.9, 5, 10, or 20. In some embodiments, the passivation layer 112 has an inner surface 112$i$ (e.g., an upper or top surface surface) conforming to the back-side surface 104$b$ of the semiconductor substrate 104 through the high absorption layer 110. Further, in some embodiments, the passivation layer 112 has an outer surface 112$o$ (e.g., a lower or bottom surface) that is planar.

A high absorption pixel sensor 102 is in the semiconductor substrate 104 and the high absorption layer 110, and comprises a photodetector 114. The photodetector 114 is configured to to absorb radiation incident on the photodetector 114 and to generate an electric signal from the absorbed radiation. For example, the electric signal may result from electron-hole pairs generated in response to absorbing photons of the radiation. The photodetector 114 comprises a photo junction 202, as well as a first doping-type region 114$a$ and a second doping-type region 114$b$. The photo junction 202 is between, and at least partially defined by, the first and second doping-type regions 114$a$, 114$b$. The photo junction 202 may be, for example, a PN junction, a PIN junction, or a combination of the foregoing, and/or may be, for example, a heterojunction, a homojunction, or a combination of the foregoing.

The first doping-type region 114$a$ is in the non-porous semiconductor layer 104$n$ and, in some embodiments, is in the porous semiconductor layer 104$p$. Further, the first doping-type region 114$a$ borders the second doping-type region 114$b$ and has an opposite doping type as the second doping-type region 114$b$. For example, the first doping-type region 114$a$ may be n-type and the second doping-type region 114$b$ may be p-type, or vice versa. The first doping-type region 114$a$ is configured to accumulate charge (e.g., electrons) from electron-hole pairs generated in response to radiation incident on the photodetector 114. For example, when an electron-hole pair is generated in the first or second doping-type region 114a, 114b, charge (e.g., an electron) of the electron-hole pair may diffuse and/or drift to the first doping-type region 114a due to an electric field generated by the photo junction 202.

The second doping-type region 114b is in the high absorption layer 110 and, in some embodiments, the semiconductor substrate 104. Further, in some embodiments, the second doping-type region 114b extends continuously with a single doping type along sidewalls of the first doping-type region 114a, and along an underside of the first doping-type region 114a, so as to cup first doping-type region 114a.

Advantageously, by arranging the photodetector 114 in the semiconductor substrate 104 and the high absorption layer 110, the photodetector 114 is highly absorptive of incident radiation, including infrared radiation. Namely, the high absorption layer 110 has a low energy bandgap, and hence a high absorption coefficient, such that the high absorption layer 110, and hence the photodetector 114, are highly absorptive of incident radiation. As a result, the photodetector 114 advantageously has high quantum efficiency. Further, the high quantum efficiency advantageously allows cost, die size, crosstalk, or a combination of the foregoing to be low when the image sensor is employed for sensing high wavelength radiation, such as infrared radiation, since high wavelength radiation may be sufficiently sensed without the semiconductor substrate 104 having a large thickness. Even more, quantum efficiency of the photodetector 114 is further enhanced by the porous semiconductor layer 104p and/or the periodic structure 106, since the porous semiconductor layer 104p and/or the periodic structure 106 enhance absorption of radiation by the semiconductor substrate 104.

In some embodiments, quantum efficiency of the photodetector 114 is further enhanced by a heterojunction at an interface between semiconductor substrate 104 and the high absorption layer 110. For example, where the high absorption layer 110 is silicon germanium and the porous semiconductor layer 104p is porous silicon, a heterojunction between the high absorption layer 110 and the porous semiconductor layer 104p may increase quantum efficiency. However, a heterojunction increases quantum efficiency at the cost of an increase in dark current, which may lead to white pixels. Namely, a mismatch in lattice constants at the heterojunction increases strain at the heterojunction, which increases dark current.

To reduce strain, and hence dark current, at the heterojunction, a carbon doped region 204 is at the heterojunction in some embodiments. The carbon doped region 204 buffers and reduces strain, thereby reducing dark current. The carbon doped region 204 may be, for example, a region of the high absorption layer 110 that has an elevated concentration of carbon relative to a remainder of the high absorption layer 110. Alternatively, the carbon doped region 204 may be, for example, a region of the semiconductor substrate 104 that has an elevated concentration of the carbon relative to a remainder of the semiconductor substrate 104. In some embodiments, the carbon doped region 204 has a doping concentration gradually increasing or decreasing from the high absorption layer 110 to the semiconductor substrate 104.

In some embodiments, quantum efficiency of the photodetector 114 is controlled by varying properties of the high absorption layer 110. However, consideration should be given to a trade-off between dark current and quantum efficiency. For example, increasing the thickness T of the high absorption layer 110 advantageously increases quantum efficiency, but does so at the cost of increased dark current. As another example, increasing the amount of germanium and/or chalcogens in the high absorption layer 110 advantageously increases quantum efficiency, but does so at the cost of increased dark current.

The high absorption pixel sensor 102 further comprises one or more pixel transistors on the front-side surface 104f of the semiconductor substrate 104 to facilitate readout of the photodetector 114. For example, the one or more pixel transistors may comprise a transfer transistor 206, a source-follower transistor (not shown), a row select transistor (not shown), a reset transistor (not shown), some other pixel transistor, or a combination of the foregoing. The transfer transistor 206 is configured to selectively transfer charge accumulated in the first doping-type region 114a out of the first doping-type region 114a for readout. In some embodiments, the transfer transistor 206 comprises a first source/drain region, a gate electrode 208, a gate dielectric layer 210, and a second source/drain region. The first source/drain region may be, for example, the first doping-type region 114a. The second source/drain region may be, for example, a floating diffusion node (FDN) 212 to which the transfer transistor 206 transfers charge from first doping-type region 114a.

The gate electrode 208 is between and borders the first and second source/drain regions, and is spaced over the semiconductor substrate 104 by the gate dielectric layer 210. The gate electrode 208 may be, for example, doped polysilicon, copper, aluminum copper, some other conductive material, or a combination of the foregoing. The gate dielectric layer 210 may be, for example, silicon dioxide, a high κ dielectric, some other dielectric, or a combination of the foregoing. The first and second source/drain regions are doped regions of the semiconductor substrate 104 having opposite doping types as surrounding regions of the semiconductor substrate 104. For example, the first and second source/drain regions may be n or p type.

In some embodiments, an isolation structure 214 extends into the front-side surface 104f of the semiconductor substrate 104, and laterally surrounds the high absorption pixel sensor 102, to electrically isolate the high absorption pixel sensor 102 from surrounding devices (not shown). Such surrounding devices may include, for example, other pixel sensors, logic devices, or memory devices. Further, in some of such embodiments, the isolation structure 214 comprises a ring-shaped layout. The isolation structure 214 may, for example, be a shallow trench isolation (STI) region, a deep trench isolation (DTI) region, an implant isolation region, or a combination of the foregoing.

An interconnect structure 216 is over the semiconductor substrate 104 and the one or more pixel transistors (e.g., the transfer transistor 206). Further, in some embodiments, the interconnect structure 216 is arranged over the isolation structure 214. The interconnect structure 216 comprises an interlayer dielectric (ILD) layer 218, a plurality of wiring layers 220, and a plurality of vias 222. For ease of illustration, only one of the wiring layers 220 is labeled 220 and only one of the vias 222 is labeled 222. The ILD layer 218 may be, for example, silicon dioxide, silicon nitride, a low κ dielectric (e.g., fluorosilicate glass (FSG)), some other dielectric, or a combination of the foregoing. A low κ dielectric is a dielectric with a dielectric constant κ less than about 3.9, 3.0, 2.0, or 1.0.

The wiring layers 220 are alternatingly stacked with the vias 222 in the ILD layer 218. The vias 222 electrically couple the wiring layers 220 together, and further electrically couple a wiring layer (not individually labeled) closest to the semiconductor substrate 104 to devices (e.g., the transfer transistor 206) on the front-side surface 104$f$ of semiconductor substrate 104. The wiring layers 220 are a conductive material, such as, for example, aluminum copper, copper, aluminum, some other conductive material, or a combination of the foregoing, and the vias 222 are a conductive material, such as, for example, copper, tungsten, some other conductive material, or a combination of the foregoing.

Figure 2B:
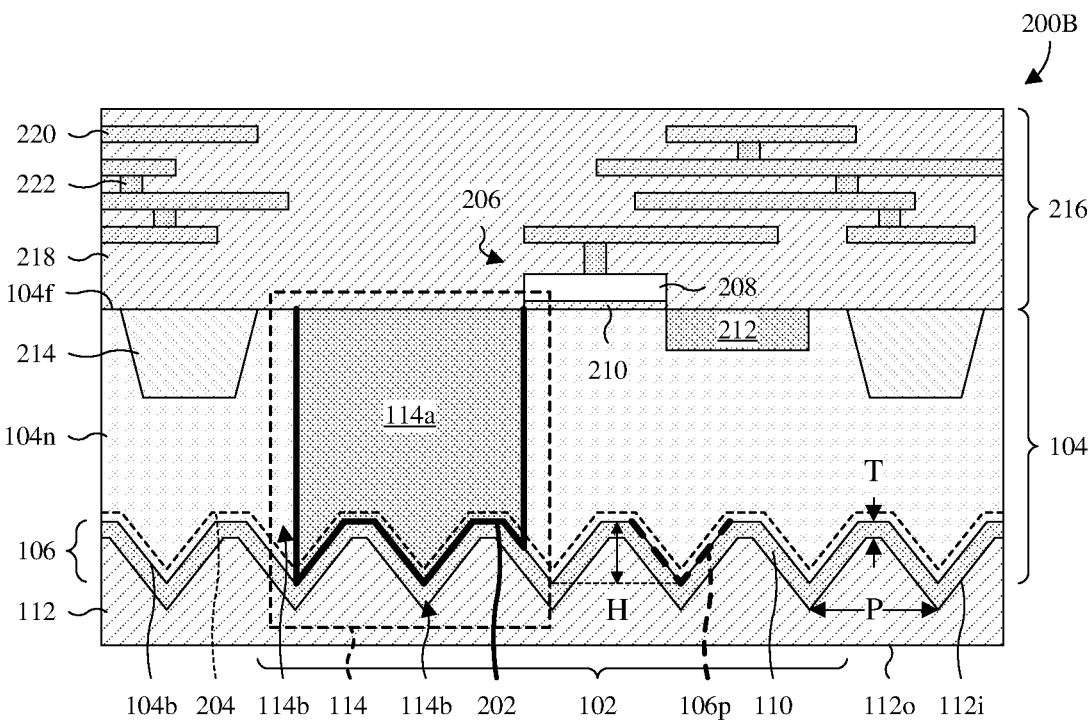
FIG. 2B illustrates a cross-sectional view of some more detailed embodiments of the image sensor of FIG. 1 without a porous semiconductor layer.

With reference to FIG. 2B, a cross-sectional view 200B of a variant of FIG. 2A is provided in which the porous semiconductor layer 104$p$ of FIG. 2A is omitted. In such embodiments, the high absorption layer 110 contacts the non-porous semiconductor layer 104$n$. Further, in some embodiments, the non-porous semiconductor layer 104$n$ defines the periodic structure 106.

While FIGS. 2A and 2B illustrate a specific embodiment of the photodetector 114, it should be appreciated that other embodiments of the photodetector 114 are amenable. For example, in embodiments where the photo junction 202 is or otherwise comprises a PIN junction, an intrinsic semiconductor region (not shown) may be arranged between and contacting the first doping-type region 114$a$ and the second doping-type region 114$b$. The intrinsic semiconductor region may be, for example, monocrystalline silicon or silicon germanium.

Figure 3:
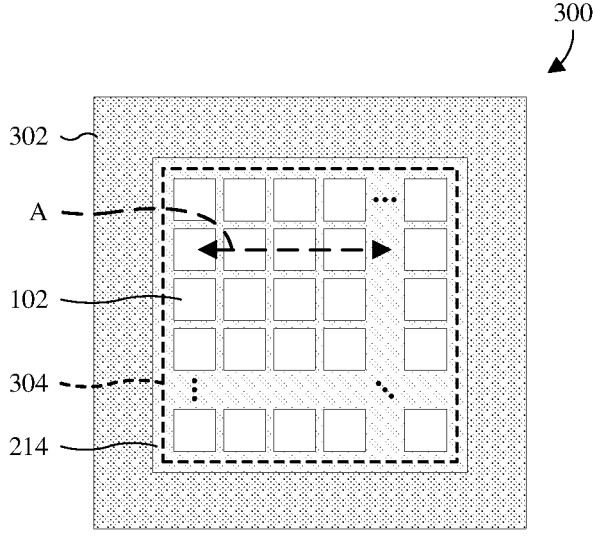
FIG. 3 illustrates a layout view of some embodiments of the image sensor of FIG. 1 and/or FIG. 2.

With reference to FIG. 3, a layout view 300 of some embodiments of the image sensor of FIG. 1, FIG. 2A, or FIG. 2B is provided. As illustrated, a logic region 302 laterally surrounds a pixel sensor array 304. The logic region 302 comprises, for example, logic and/or memory devices (not shown) configured to read and/or store data generated by the pixel sensor array 304 in response to incident radiation.

The pixel sensor array 304 is made up of a plurality of high absorption pixel sensors 102 arranged in X rows and Y columns. X and Y are integer values greater than zero and may be, for example, the same or different. For example, X and Y may both be 128, 256, 512, 1024, 2048, 4096, or X and Y may respectively be 768 and 1024, 1024 and 2048, 256 and 1024, 512 and 128, or 4096 and 1024. For ease of illustration, only one of the high absorption pixel sensors 102 is labeled 102. The high absorption pixel sensors 102 are individually configured as described with regard to FIG. 1, FIG. 2A, or FIG. 2B.

An isolation structure 214 laterally surrounds the pixel sensor array 304 to electrically isolate the pixel sensor array 304 from the logic region 302. Further, the isolation structure 214 laterally surrounds each of the high absorption pixel sensors 102 to electrically isolate the high absorption pixel sensors 102 from each other.

Figure 4A:
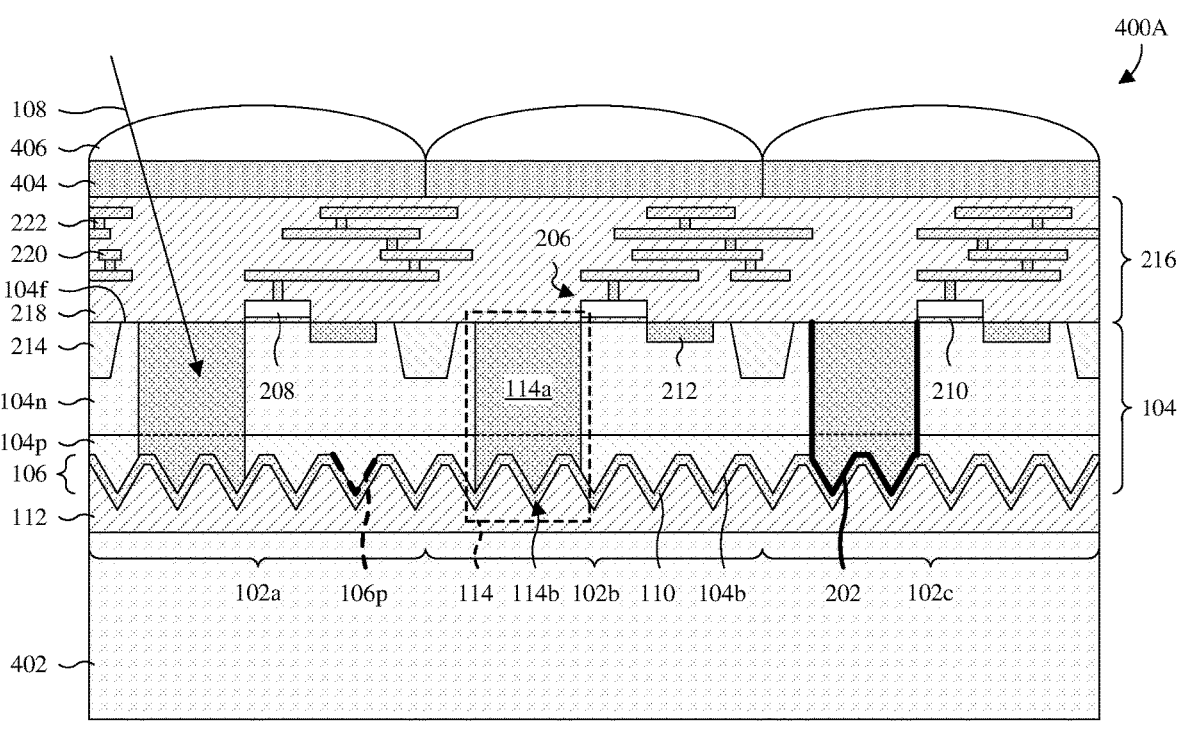
FIG. 4A illustrated a cross-sectional view of some front-side illuminated (FSI) embodiments of the image sensor of FIG. 3.
Figure 4B:
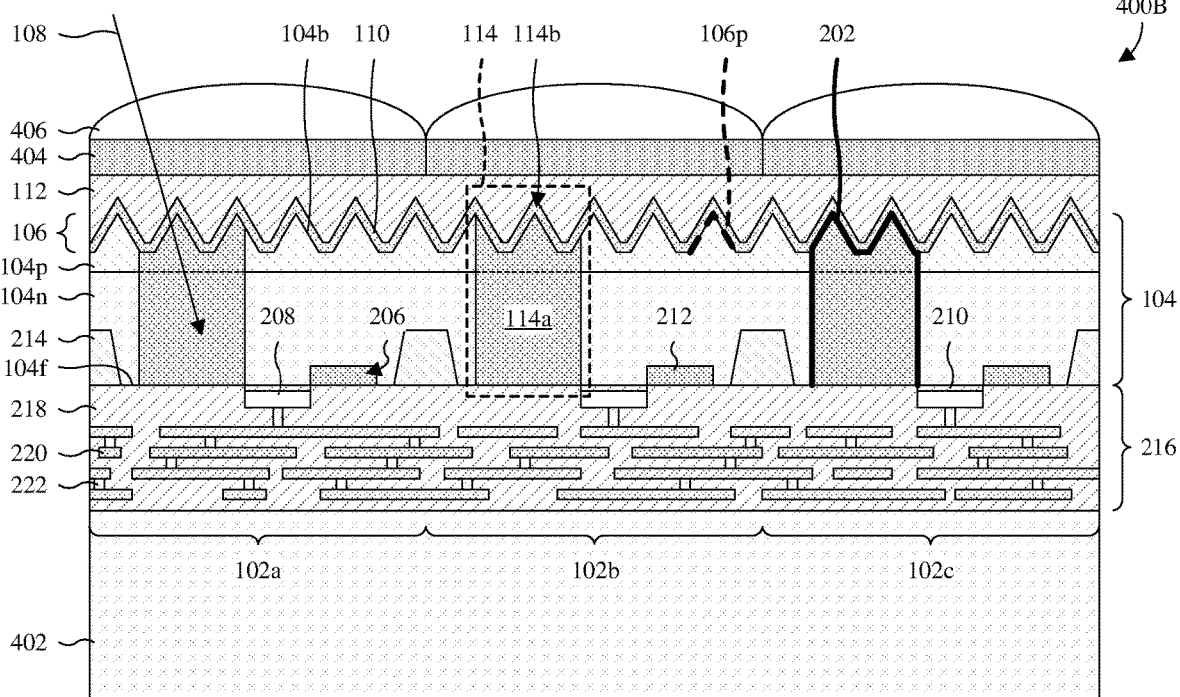
FIG. 4B illustrated a cross-sectional view of some back-side illuminated (BSI) embodiments of the image sensor of FIG. 3.

With reference to FIGS. 4A and 4B, cross-sectional views 400A, 400B of various embodiments of the image sensor of FIG. 3 are provided. The cross-sectional views 400A, 400B may, for example, be taken along line A in FIG. 3.

As illustrated by the cross-sectional view 400A of FIG. 4A, the image sensor is FSI, and comprises a plurality of high absorption pixel sensors 102$a$-102$c$. The high absorption pixel sensors 102$a$-102$c$ are each configured according to the high absorption pixel sensor 102 of FIG. 1, FIG. 2A, or FIG. 2B, and are each configured to receive radiation 108 through an interconnect structure 216 covering the high absorption pixel sensors 102$a$-102$c$. The high absorption pixel sensors 102$a$-102$c$ each comprise a photodetector 114 and, in some embodiments, one or more pixel transistors. For example, the high absorption pixel sensors 102$a$-102$c$ may each comprise a transfer transistor 206. For ease of illustration, only one of the photodetectors 114 is labeled 114, and only one of the transfer transistors 206 is labeled 206.

The interconnect structure 216 comprises an interlayer dielectric (ILD) layer 218, a plurality of wiring layers 220, and a plurality of vias 222. For ease of illustration, only one of the wiring layers 220 is labeled 220, and only one of the vias 222 is labeled 222. The wiring layers 220 are alternatingly stacked with the vias 222 in the ILD layer 218. In some embodiments, the wiring layers 220 and the vias 222 are limited to sides of the photodetectors 114 (i.e., are not directly over the photodetectors 114) so radiation is not blocked from impinging on the photodetectors 114.

The photodetectors 114 are in a semiconductor substrate 104 and a high absorption layer 110 stacked under the interconnect structure 216. Further, in some embodiments, the photodetectors 114 are electrically isolated by an isolation structure 214 (e.g., an STI region) between the high absorption pixel sensors 102$a$-102$c$. The photodetectors 114 each comprise a first doping-type region 114$a$ in the semiconductor substrate 104, a second doping-type region 114$b$ in the high absorption layer 110, and a photo junction 202 at least partially defined by the first and second doping-type regions 114$a$, 114$b$. For ease of illustration, only one of the first doping-type regions 114$a$ is labeled 114$a$, only one of the second doping-type regions 114$b$ is labeled 114$b$, and only one of the photo junctions 202 is labeled 202.

The transfer transistors 206 are on a front-side surface 104$f$ of the semiconductor substrate 104, between the semiconductor substrate 104 and the interconnect structure 216. The transfer transistors 206 each comprise a gate electrode 208 and a gate dielectric layer 210 spacing the gate electrode 208 from the semiconductor substrate 104. Further, the transfer transistors 206 each comprise a first source/drain region and a second source/drain region respectively bordering opposite sidewalls of the gate electrode 208. The first source/drain region may be, for example, a first doping-type region 114$a$ of a respective photodetector 114, and/or the second source/drain region may be, for example, a FDN 212. For ease of illustration, only one of the gate electrodes 208 is labeled 208, only one of the FDNs 212 is labeled 212, and only one of the gate dielectric layers 210 is labeled 210.

The semiconductor substrate 104 overlies the high absorption layer 110, such that the high absorption layer 110 is on a back-side surface 104$b$ of the semiconductor substrate 104. The semiconductor substrate 104 comprises a non-porous semiconductor layer 104$n$ and a porous semiconductor layer 104$p$ underlying the non-porous semiconductor layer 104$n$. In alternative embodiments, the porous semiconductor layer 104$p$ is omitted, such that the non-porous semiconductor layer 104$n$ completely fills the space presently occupied by the porous semiconductor layer 104$p$ in FIG. 4A.

In some embodiments, the semiconductor substrate 104 defines a periodic structure 106 along the back-side surface 104$b$ of the semiconductor substrate 104. The periodic structure 106 may comprise, for example, a plurality of protrusions 106$p$ in a periodic pattern or array along the back-side surface 104$b$ of the semiconductor substrate 104. For ease of illustration, only one of the protrusions 106$p$ is labeled 106$p$.

The high absorption layer 110 has a low energy band gap. For example, the high absorption layer 110 may have an energy bandgap less than about 1.0 eV, 0.8 eV, or 0.5 eV. Due to the low energy bandgap, the high absorption layer 110 has a high absorption coefficient. Further, the photodetectors 114, which are partially in the high absorption layer 110, have high quantum efficiency. In some embodiments, the high absorption layer 110 is silicon germanium, or monocrystalline silicon doped with a chalcogen. Further, in some embodiments, the high absorption layer 110 has a doping type opposite that of the first doping-type regions 114a.

A passivation layer 112 underlies the high absorption layer 110 and, in some embodiments, a carrier substrate 402 underlies and is bonded to the passivation layer 112. The carrier substrate 402 may be, for example, a bulk semiconductor substrate and/or monocrystalline silicon. Further, the carrier substrate 402 may be, for example, a semiconductor wafer (e.g., a 450 millimeter silicon wafer).

In some embodiments, color filters 404 respectively cover the high absorption pixel sensors 102a-102c. The color filters 404 are configured to pass assigned wavelengths of radiation, while blocking unassigned wavelengths of radiation. For example, a color filter may be configured to pass red wavelengths of radiation, while blocking blue wavelengths of radiation, whereas another color filter may be configured to pass blue wavelengths of radiation, while blocking red wavelengths of radiation. In some embodiments, the color filters 404 are respectively covered by micro-lenses 406 configured to focus incident radiation on respective photodetectors of the high absorption pixel sensors 102a-102c. For ease of illustration, only one of the color filters 404 is labeled 404, and only one of the micro-lenses 406 is labeled 406.

As illustrated by the cross-sectional view 400B of FIG. 4B, a variant of FIG. 4A is provided in which the image sensor is BSI. In contrast with FIG. 4A, the high absorption pixel sensors 102a-102c are over the interconnect structure 216. Further, the high absorption pixel sensors 102a-102c are each configured to receive radiation 108 through the back-side surface 104b of the semiconductor substrate 104. In some embodiments, the porous semiconductor layer 104p and/or the periodic structure 106 reduce reflection of the radiation 108 off the semiconductor substrate 104, such that the absorption may be enhanced. Reflectance may, for example, be reduced since radiation 108 may enter the semiconductor substrate 104 through pores in the porous semiconductor layer 104p and become trapped in the semiconductor substrate 104. Further, reflectance may, for example, be reduced since angled sidewalls of the protrusions 106p of the periodic structure 106 may reduce the likelihood of radiation reflecting away from the semiconductor substrate 104.

With reference to FIGS. 5-13, a series of cross-sectional views 500-1300 of some embodiments of a method for manufacturing a FSI image sensor with high absorption pixel sensors is provided. For example, the method may be employed to manufacture the image sensor of FIG. 4A.

Figure 5:
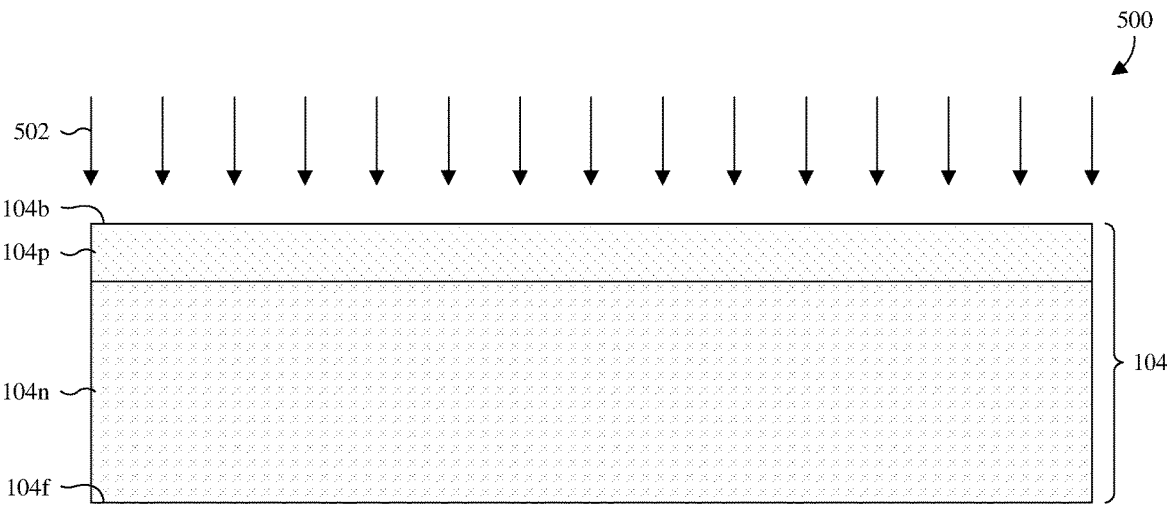
FIGS. 5-13 illustrate a series of cross-sectional views of some embodiments of a method for manufacturing a FSI image sensor with high absorption pixel sensors.

As illustrated by the cross-sectional view 500 of FIG. 5, a semiconductor substrate 104 is provided. In some embodiments, the semiconductor substrate 104 comprises a non-porous semiconductor layer 104n and a porous semiconductor layer 104p. The non-porous semiconductor layer 104n is along a front-side surface 104f of the semiconductor substrate 104, and the porous semiconductor layer 104p is along a back-side surface 104b of the semiconductor substrate 104 that is opposite the front-side surface 104f of the semiconductor substrate 104. In alternative embodiments, the porous semiconductor layer 104p is omitted. In some of such embodiments, the non-porous semiconductor layer 104n is along both the front-side surface 104f of the semiconductor substrate 104 and the back-side surface 104b of the semiconductor substrate 104. Further, in some of such embodiments, the non-porous semiconductor layer 104n defines the whole of the semiconductor substrate 104.

The porous semiconductor layer 104p is a semiconductor material with a systematic structure of pores. The pores may be, for example, micrometer sized pores, nanometer sized pores, smaller sized pores, or a combination of the foregoing. The porous semiconductor layer 104p may be, for example, nanoporous silicon. The non-porous semiconductor layer 104n is a semiconductor material without a systematic structure of pores, where the pores are sized as described above. For example, the non-porous semiconductor layer 104n may be a semiconductor material without a systematic structure of nanometer and/or micrometer sized pores. The non-porous semiconductor layer 104n may be, for example, monocrystalline silicon or some other type of crystalline semiconductor material.

In some embodiments, the process for providing the semiconductor substrate 104 comprises performing an etch into the non-porous semiconductor layer 104n to form the porous semiconductor layer 104p from a portion of the non-porous semiconductor layer 104n. The etch may, for example, be performed by applying a solution 502 of hydrofluoric acid to the non-porous semiconductor layer 104n, and subsequently activating the hydrofluoric acid while the solution 502 is on the non-porous semiconductor layer 104n. The hydrofluoric acid may, for example, be activated: electrochemically by applying a sufficient voltage to the solution 502 (anodic etching); electrochemically by adding an oxidant with a sufficient standard electrode potential to the solution 502 (stain etching); or photoelectrochemically by irradiating the solution 502 with a laser or lamp with a sufficiently short wavelength to excite electrons in the solution 502 and/or the non-porous semiconductor layer 104n to the conduction band. In some embodiments, the solution 502 further includes a ferric nitride.

Figure 6:
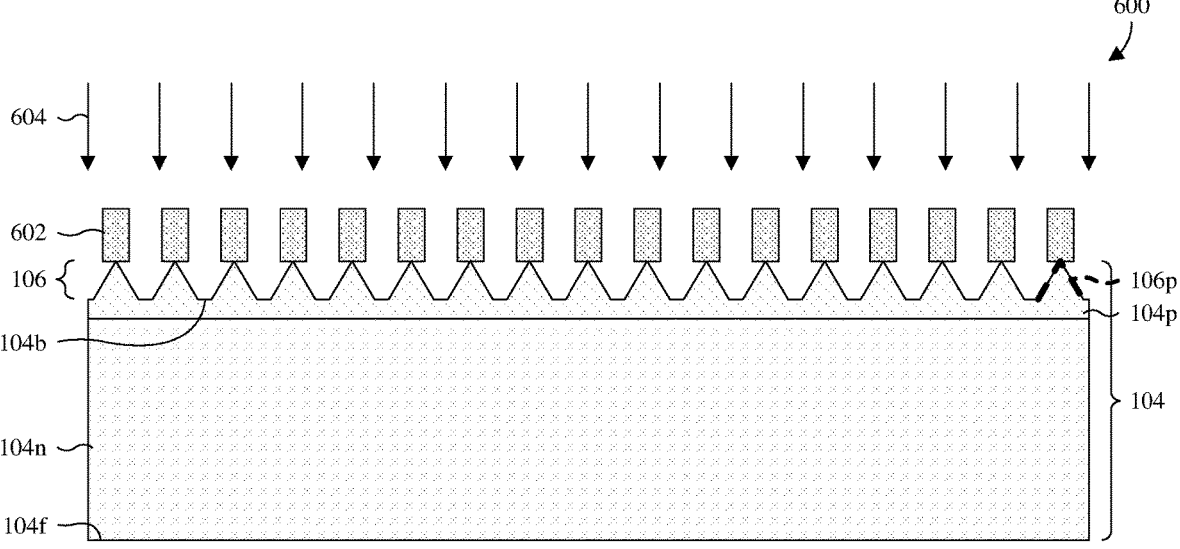

As illustrated by the cross-sectional view 600 of FIG. 6, a periodic structure 106 is formed in the back-side surface 104b of the semiconductor substrate 104. In some embodiments where the porous semiconductor layer 104p is present, the periodic structure 106 is formed directly in the porous semiconductor layer 104p. In some embodiments where the porous semiconductor layer 104p is omitted, the periodic structure 106 is formed directly in the non-porous semiconductor layer 104n. In some embodiments, the periodic structure 106 comprises a plurality of protrusions 106p in a periodic pattern. For ease of illustration, only one of the protrusions 106p is labeled 106p. The periodic pattern may, for example, be a two-dimensional array of protrusions in a plurality of rows and a plurality of columns.

In some embodiments, the process for forming the periodic structure 106 comprises selectively dry etching the back-side surface 104b of a semiconductor substrate 104. For example, a photoresist layer 602 may be formed on the back-side surface 104b, and patterned with the periodic pattern of the protrusions 106p. A dry etchant 604 may then be applied to the back-side surface 104b with the photoresist layer 602 in place to form the protrusions 106p, and the photoresist layer 602 may be subsequently stripped. In some embodiments, the process for forming the periodic structure 106 further comprises wet etching the back-side surface 104b of the semiconductor substrate 104 to remove damage to the semiconductor substrate 104 from the selective dry etching. For example, a wet etchant (not shown) may be applied to the back-side surface 104b before or after the photoresist layer 602 is stripped. The wet etchant may be, for example, tetramethylammonium hydroxide (TMAH).

The damage to the semiconductor substrate 104 may lead to electron traps along the back-side surface 104*b* of a semiconductor substrate 104. Further, the electron traps may, in turn, lead to leakage current, dark current and white pixels, or a combination of the foregoing since photodetectors formed hereafter are formed in the semiconductor substrate 104, along the back-side surface 104*b*. Therefore, the wet etch advantageously removes the electron traps.

Figure 7:
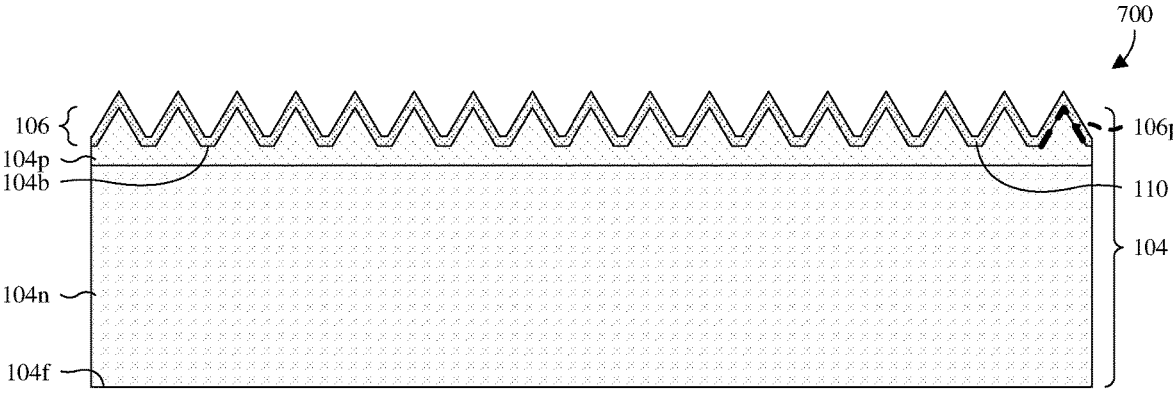

As illustrated by the cross-sectional view 700 of FIG. 7, a high absorption layer 110 is formed on the back-side surface 104*b* of a semiconductor substrate 104. In some embodiments where the porous semiconductor layer 104*p* is present, the high absorption layer 110 is formed in direct contact with the porous semiconductor layer 104*p*. In some embodiments where the porous semiconductor layer 104*p* is omitted, the high absorption layer 110 is formed in direct contact with the non-porous semiconductor layer 104*n*. In some embodiments, the high absorption layer 110 is formed conformally. In some embodiments, the high absorption layer 110 is formed with the same doping type as the porous semiconductor layer 104*p* and/or the non-porous semiconductor layer 104*n*. In some embodiments, the high absorption layer 110 is formed of a semiconductor material with a direct bandgap, and/or is formed with a low band gap. A low band gap may be, for example, a band gap that is less than about 1.0 eV, 0.8 eV, or 0.5 eV, and/or that is less than a bandgap of the non-porous semiconductor layer 104*n*.

In some embodiments, the high absorption layer 110 is formed as a doped region of the semiconductor substrate 104. In some of such embodiments, the high absorption layer 110 is doped with a chalcogen, such as, for example, S, Se, Te, or a combination. The doping may, for example, be performed by ion implantation into the back-side surface 104*b* of the semiconductor substrate 104. Further, in some embodiments where the high absorption layer 110 is doped with the chalcogen, the high absorption layer 110 is doped in excess of the solubility limit (i.e., is supersaturated) to advantageously facilitate sub-band gap absorption of photons. The supersaturation may, for example, be performed by ion implantation into the back-side surface 104*b*, followed by pulsed laser melting (e.g., 1-7, 2-6, 3-5, or 4 laser shots).

In other embodiments, the high absorption layer 110 is an epitaxial layer. In some of the epitaxial embodiments, the high absorption layer 110 is silicon germanium, or alternatively silicon (e.g., a monocrystalline silicon) doped with a chalcogen. For example, the epitaxial layer may be silicon doped with S, Se, Te, or a combination of the foregoing. Further, in some of the epitaxial embodiments, the high absorption layer 110 may be supersaturated with a chalcogen as described above. The epitaxy may, for example, be performed by, for example, chemical vapor deposition, physical vapor deposition, or molecular beam epitaxy, and/or the doping may, for example, be performed by ion implantation.

Figure 8:
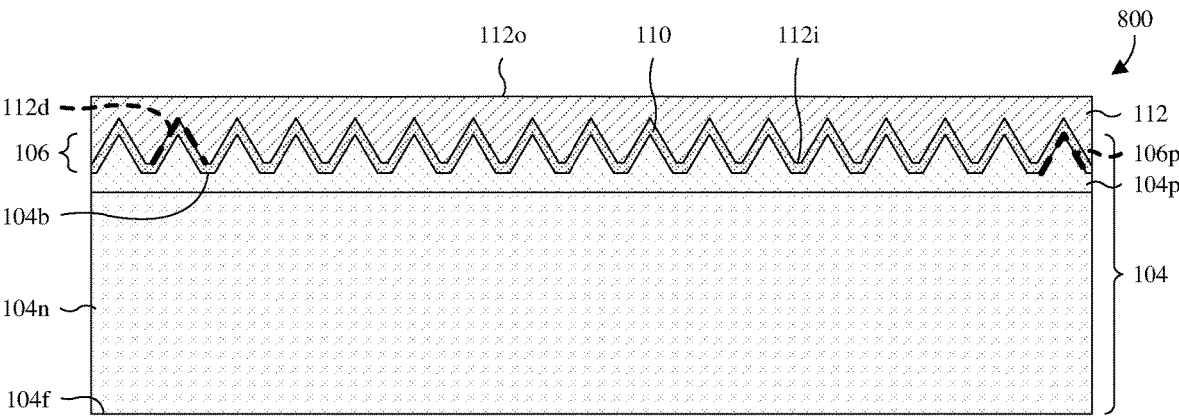

As illustrated by cross-sectional view 800 of FIG. 8, a passivation layer 112 is formed over the high absorption layer 110. In some embodiments, the passivation layer 112 is formed with an inner surface 112*i* conforming to the back-side surface 104*b* of the semiconductor substrate 104 and/or to the high absorption layer 110. For example, the passivation layer 112 may comprise a plurality of depressions 112*d* respectively receiving the protrusions 106*p* of the periodic structure 106. Further, in some embodiments, the passivation layer 112 is formed with an outer surface 112*o* that is planar and that is on an opposite side of the passivation layer 112 as the high absorption layer 110.

The process for forming the passivation layer 112 may comprise, for example, depositing or growing the passivation layer 112. The depositing or growing may be performed by, for example, thermal oxidation, chemical or physical vapor deposition, sputtering, some other deposition or growth process, or a combination of the foregoing. Further, the process for forming the passivation layer 112 may comprise, for example, performing a planarization into the outer surface 112*o* of the passivation layer 112. The planarization may, for example, be performed by a chemical mechanical polish (CMP).

Figure 9:
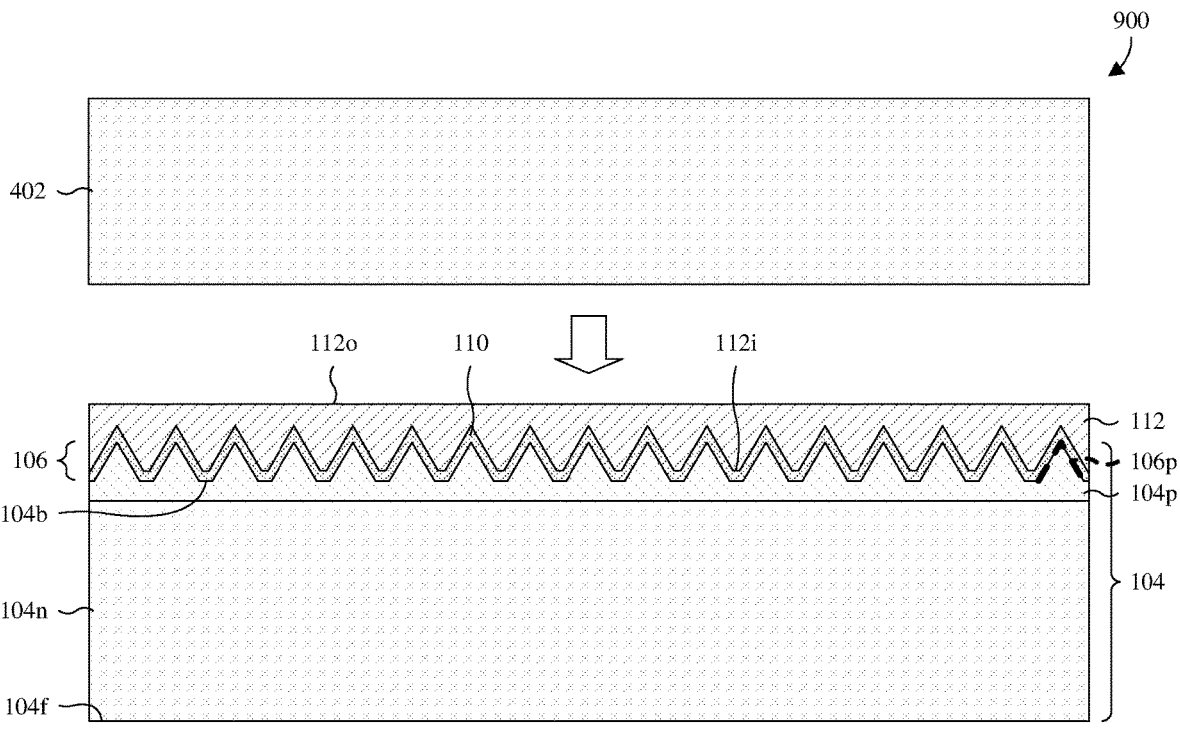

As illustrated by the cross-sectional view 900 of FIG. 9, in some embodiments, the passivation layer 112 is bonded to a carrier substrate 402 at the outer surface 112*o* of the passivation layer 112. The carrier substrate 402 may be, for example, monocrystalline silicon or some other semiconductor material. In some embodiments, the bonding process comprises a fusion bonding process.

Figure 10:
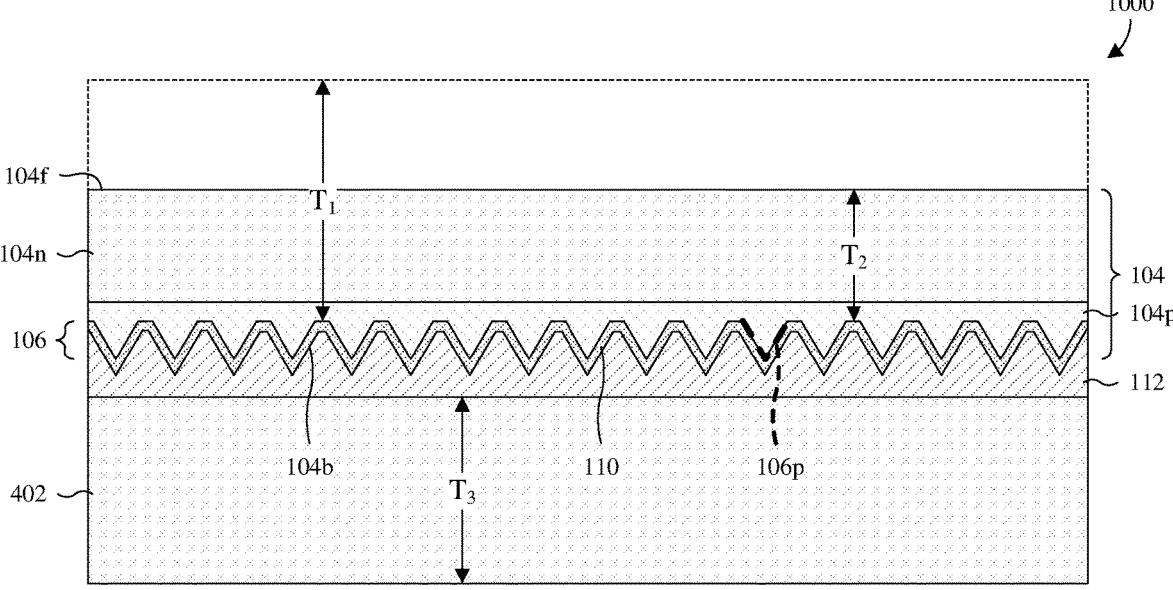

As illustrated by the cross-sectional view 1000 of FIG. 10, the structure of FIG. 9 is flipped vertically and, in some embodiments, the semiconductor substrate 104 is thinned to reduce a thickness of the semiconductor substrate 104 from a first thickness $T_1$ to a second thickness $T_2$. The second thickness $T_2$ may, for example, be less than a third thickness $T_3$ of the carrier substrate 402. In some embodiments, the semiconductor substrate 104 is thinned by performing an etch into the front-side surface 104*f* of the semiconductor substrate 104 and/or by performing a planarization into the front-side surface 104*f* of the semiconductor substrate 104. The planarization may, for example, be performed by a CMP.

Figure 11:
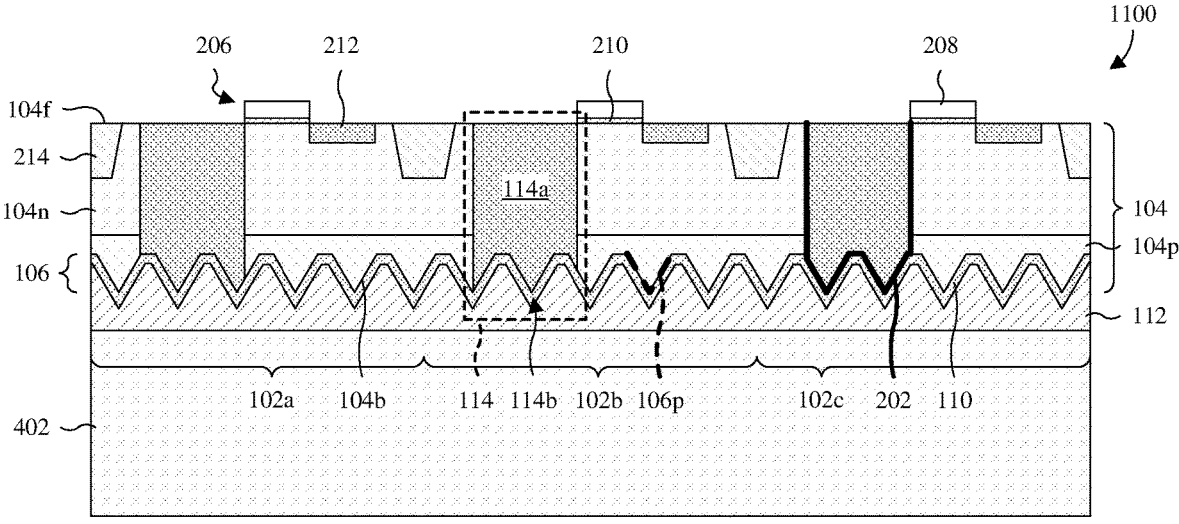

As illustrated by the cross-sectional view 1100 of FIG. 11, a plurality of high absorption pixel sensors 102*a*-102*c* are formed on the front-side surface 104*f* of the semiconductor substrate 104. Each of the high absorption pixel sensors 102*a*-102*c* is formed with a photodetector 114 and, in some embodiments, one or more pixel transistors. The one or more pixel transistors for a pixel sensor may comprise, for example, a transfer transistor 206, a source follower transistor (not shown), a reset transistor (not shown), a row select transistor (not shown), or a combination of the foregoing. For ease of illustration, only one of the photodetectors 114 is labeled 114, and only one of the transfer transistors 206 is labeled 206.

The photodetectors 114 are each formed with a first doping-type region 114*a*, a second doping-type region 114*b*, and a photo junction 202. For ease of illustration, only one of first doping-type regions 114*a* is labeled 114*a*, only one of the second doping-type regions 114*b* is labeled 114*b*, and only one of the photo junctions 202 is labeled 202. The first doping-type regions 114*a* are formed in the semiconductor substrate 104 and are formed with an opposite doping type as the second doping-type regions 114*b*. The second doping-type regions 114*b* are formed bordering the first doping-type regions 114*a*, and are formed in the high absorption layer 110 and, in some embodiments, the semiconductor substrate 104. The photo junctions 202 are formed as PN and/or PIN junctions and are at least partially defined by the first doping-type regions 114*a* and the second doping-type regions 114*b*.

In some embodiments, the semiconductor substrate 104 and/or the high absorption layer 110 initially have a single, first doping type, such that the photodetectors 114 may be formed by forming the first doping-type regions 114*a* in the semiconductor substrate 104 with a second doping type opposite the first doping type. The first doping-type regions 114*a* may, for example, be formed by selectively implanting dopants into the semiconductor substrate 104.

The transfer transistors 206 each comprise a gate electrode 208, a gate dielectric layer 210, a first source/drain region, and a second source/drain region. The first source/drain region may be, for example, a respective one of the first doping-type regions **114*a*. The second source/drain region may be, for example, a FDN 212. For ease of illustration, only one of the gate electrodes 208 is labeled 208, only one of the gate dielectric layers 210 is labeled 210, and only one of the FDNs 212 is labeled 212. The gate electrodes 208 are spaced over the semiconductor substrate 104 by the gate dielectric layers 210**, and each have opposite sides respectively bordering a first source/drain region and a second source/drain region.

In some embodiments, the process for forming the transfer transistors 206 (or other pixel transistors) is performed before forming the photodetectors 114. Further, in some embodiments, the process for forming the transfer transistors 206 comprises forming a dielectric layer and an electrode layer stacked over the semiconductor substrate 104. The dielectric layer may be formed by, for example, thermal oxidation, vapor deposition, sputtering, some other deposition or growth process, or a combination of the foregoing. The electrode layer may be formed by, for example, electrochemical plating, vapor deposition, sputtering, some other deposition or growth process, or a combination of the foregoing. Further, in some embodiments, the process for forming the transfer transistors 206 comprises performing a selective etch into the dielectric layer and the electrode layer to define the gate electrodes 208 and the gate dielectric layers 210. The selective etching may, for example, be performed using photolithography. Even more, in some embodiments, the process for forming the transfer transistors 206 comprises selectively implanting dopants into the semiconductor substrate 104, thereby defining the first doping-type regions **114*a* of the photodetectors 114 and the FDNs 212**.

Also illustrated by the cross-sectional view 1100 of FIG. 11, an isolation structure 214 is formed between regions of the semiconductor substrate 104 corresponding to the high absorption pixel sensors **102*a*-102*c*. The isolation structure 214 may, for example, be formed as an STI region, a DTI region, an implant isolation region, or a combination of the foregoing. In some embodiments, the process for forming the isolation structure 214 comprises selectively etching the semiconductor substrate 104 to form trenches, and subsequently forming one or more dielectric materials filling the trenches. Further, in some embodiments, the isolation structure 214 is formed prior to forming the high absorption pixel sensors 102*a*-102*c***.

Figure 12:
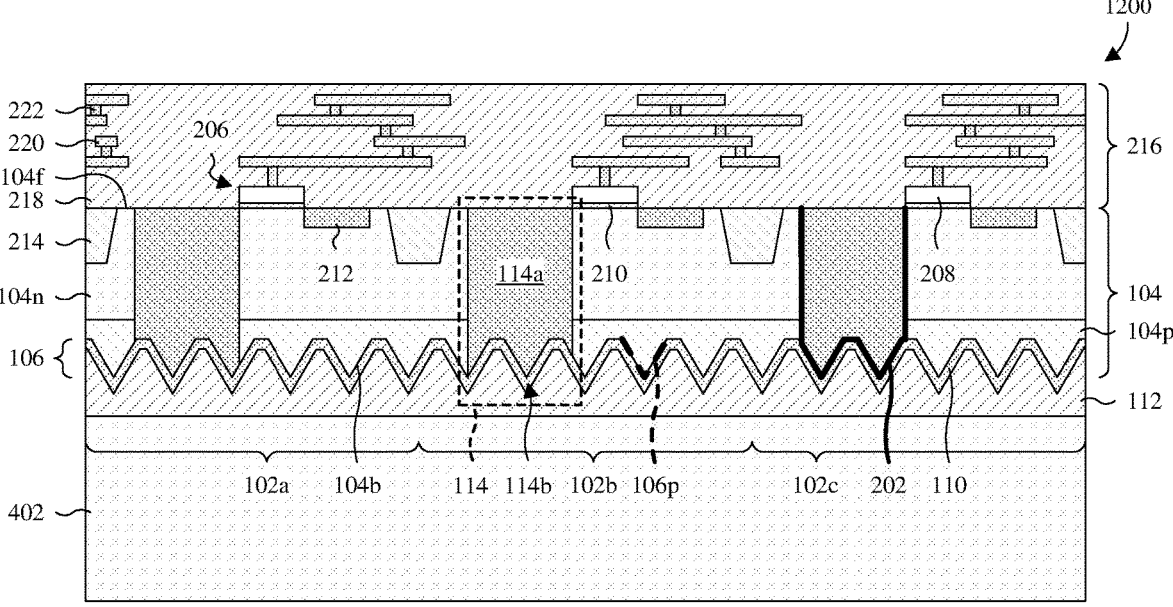

As illustrated by the cross-sectional view 1200 of FIG. 12, an interconnect structure 216 is formed over the high absorption pixel sensors **102*a*-102*c* and the semiconductor substrate 104. The interconnect structure 216 comprises an ILD layer 218, a plurality of wiring layers 220, and a plurality of vias 222. For ease of illustration, only one of the wiring layers 220 is labeled 220, and only one of the vias 222 is labeled 222. The wiring layers 220 are alternatingly stacked with the vias 222 in the ILD layer 218**.

In some embodiments, the process for forming the interconnect structure 216 comprises repeatedly forming an ILD sublayer (i.e., a sublayer of the ILD layer 218) over the semiconductor substrate 104, performing a planarization into an upper or top surface of the ILD sublayer, selectively etching the ILD sublayer to form a via opening and/or a wiring opening, and filling the via opening and/or the wiring opening with a conductive material. The ILD sublayer may, for example, be formed by thermal oxidation, chemical or physical vapor deposition, sputtering, some other growth or deposition process, or a combination of the foregoing. The planarization may, for example, be performed by a CMP. The selective etching may, for example, be performed using photolithography. The filling may, for example, be performed by chemical or physical vapor deposition, electro-plating, electro-less plating, some other growth or deposition process, or a combination of the foregoing. In some embodiments, the process for forming the interconnect structure 216 comprises repeatedly performing a dual-damascene-like process or a single-damascene-like process to form the wiring layers 220 and the vias 222. The dual-damascene-like and single-damascene-like processes are respectively dual-damascene and single damascene processes that are not restricted to copper.

Figure 13:
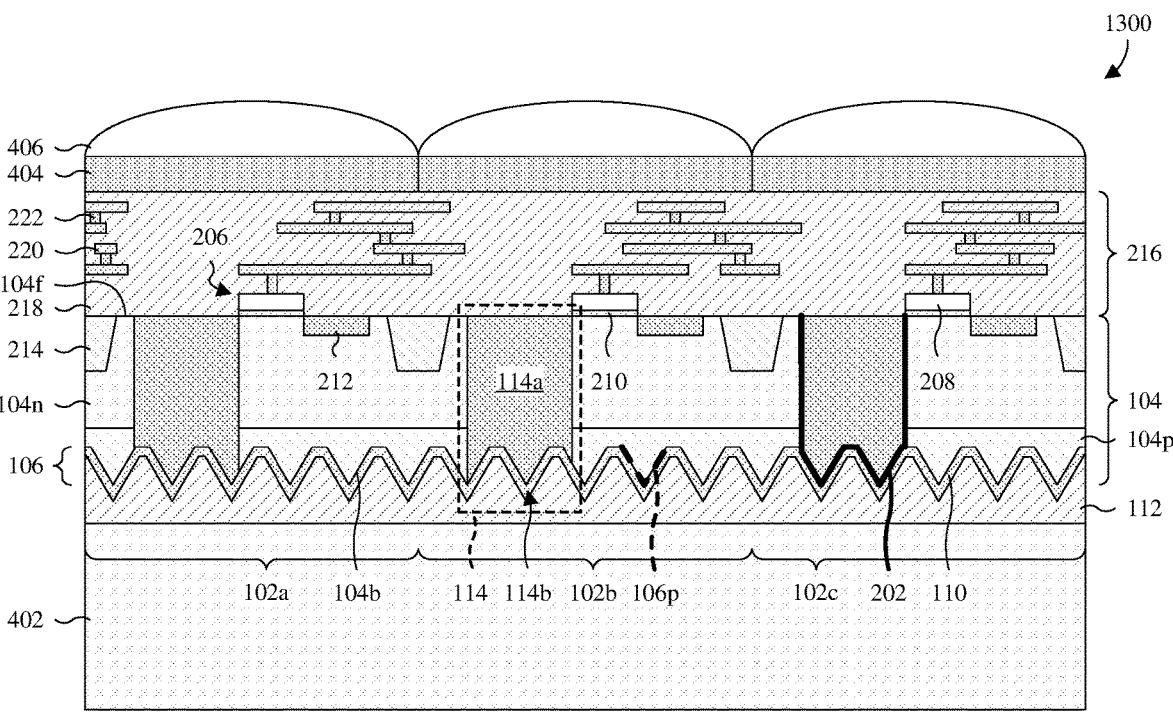

As illustrated by the cross-sectional view 1300 of FIG. 13, a plurality of color filters 404 are formed respectively over the high absorption pixel sensors **102*a*-102*c*. For ease of illustration, only one of the color filters 404 is labeled 404. In some embodiments, the color filters 404** are formed by forming a color filter layer assigned wavelengths of radiation (e.g., red wavelengths), patterning the color filter layer, and then repeating the foregoing for different wavelengths of radiation (e.g., blue wavelengths).

Also illustrated by the cross-sectional view 1300 of FIG. 13, a plurality of micro-lenses 406 are formed respectively over the color filters 404. In some embodiments, the process for forming the micro-lenses 406 comprises forming a micro-lens layer over the color filters 404, and subsequently forming micro-lens templates individual to the micro-lenses 406 over the micro-lens layer. The micro-lens layer may, for example, be formed by a spin-on process or a deposition process. The micro-lens templates may, for example, be formed by depositing (e.g., by sputtering) a photoresist layer over the micro-lens layer, patterning the photoresist layer with a layout of the micro-lenses to form the micro-lens templates, and performing a reflow operation to curve upper or top surfaces of the micro-lens templates. In some embodiments, the process further comprises etching the micro-lens layer with the micro-lens templates in place, and stripping the micro-lens templates.

With reference to FIG. 14, a flowchart 1400 of some embodiments of the method of FIGS. 5-13 is provided.

At 1402, a semiconductor substrate is provided, where the semiconductor substrate comprises a non-porous semiconductor layer along a front side of the semiconductor substrate. In some embodiments, the semiconductor substrate further comprises a porous semiconductor layer along a back side of the semiconductor substrate. See, for example, FIG. 5.

At 1404, an etch is performed into the back side of the semiconductor substrate to form a periodic structure on the back side of the semiconductor substrate. See, for example, FIG. 6.

At 1406, a high absorption layer is formed lining the back side of the semiconductor substrate. See, for example, FIG. 7. The high absorption layer has a low energy bandgap (e.g., less than about 1 eV and/or less than that of the non-porous semiconductor layer), such that the high absorption layer advantageously has a high absorption coefficient. The high absorption layer may be, for example, silicon germanium, or monocrystalline silicon dope with a chalcogen.

At 1408, a passivation layer is formed covering the high absorption layer on the back side of the semiconductor substrate. See, for example, FIG. 8.

At 1410, in some embodiments, a carrier substrate is bonded to the back side of the semiconductor substrate through the passivation layer and the high absorption layer. See, for example, FIG. 9.

At 1412, in some embodiments, the semiconductor substrate is thinned through the front side of the semiconductor substrate. See, for example, FIG. 10.

At 1414, a pixel sensor is formed on the front side of the semiconductor substrate, where the pixel sensor comprises a photodetector in the semiconductor substrate and the high absorption layer. See, for example, FIG. 11. Advantageously, by arranging the photodetector in the high absorption layer, the photodetector has high quantum efficiency.

At 1416, an interconnect structure is formed covering the pixel sensor on the front side of the semiconductor substrate, where the interconnect structure comprises wiring layers and vias alternatingly stacked with the wiring layers. See, for example, FIG. 12.

At 1418, a color filter and a micro-lens are formed stacked over the pixel sensor on the front side of the semiconductor substrate. See, for example, FIG. 13.

While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 15-23, a series of cross-sectional views 1500-2300 of some embodiments of a method for manufacturing a BSI image sensor with high absorption pixel sensors is provided. For example, the method may be employed to manufacture the BSI image sensor of FIG. 4B.

Figure 15:
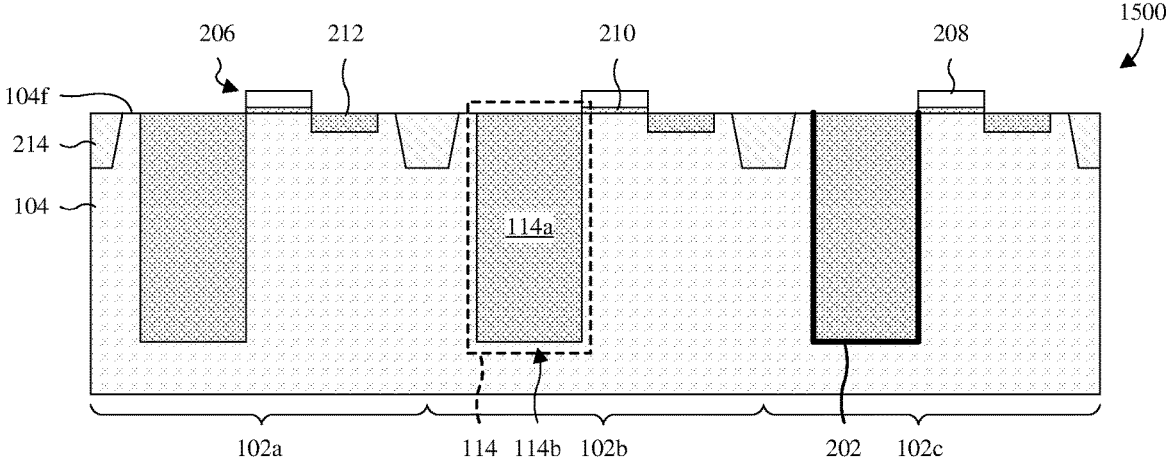
FIGS. 15-23 illustrate a series of cross-sectional views of some embodiments of a method for manufacturing a BSI image sensor with high absorption pixel sensors.

As illustrated by the cross-sectional view 1500 of FIG. 15, a plurality of high absorption pixel sensors 102a-102c are formed on a front-side surface 104f of a semiconductor substrate 104. Further, in some embodiments, an isolation structure 214 is formed to demarcate regions of the semiconductor substrate 104 corresponding to the high absorption pixel sensors 102a-102c. The high absorption pixel sensors 102a-102c and/or the isolation structure 214 may, for example, be formed as described with regard to FIG. 11.

Figure 16:
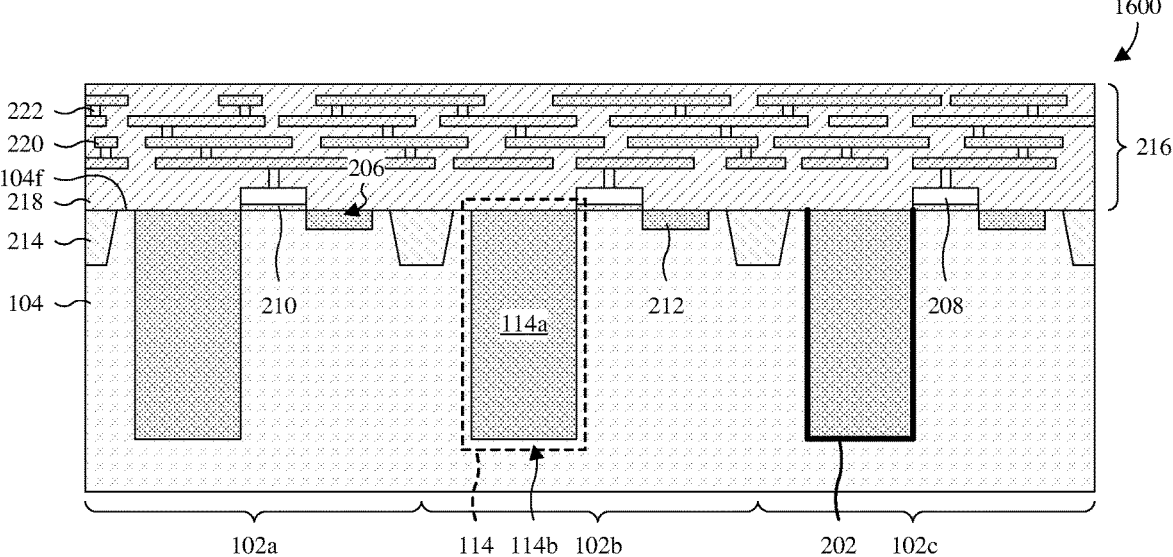

As illustrated by the cross-sectional view 1600 of FIG. 16, an interconnect structure 216 is formed over the high absorption pixel sensors 102a-102c and the semiconductor substrate 104. The interconnect structure 216 may, for example, be formed as described with regard to FIG. 12.

Figure 17:
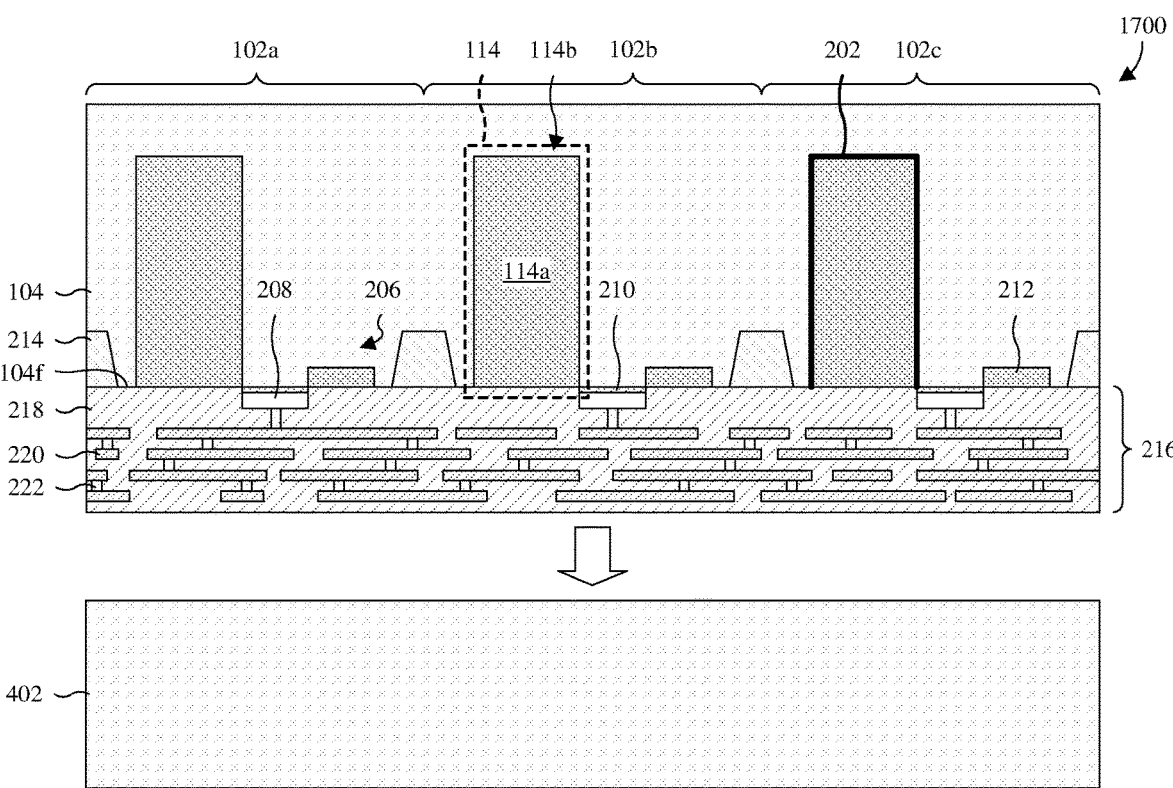

As illustrated by the cross-sectional view 1700 of FIG. 17, in some embodiments, the structure of FIG. 16 is flipped vertically and bonded to a carrier substrate 402. The bonding may, for example, be performed as described with regard to FIG. 9.

Figure 18:
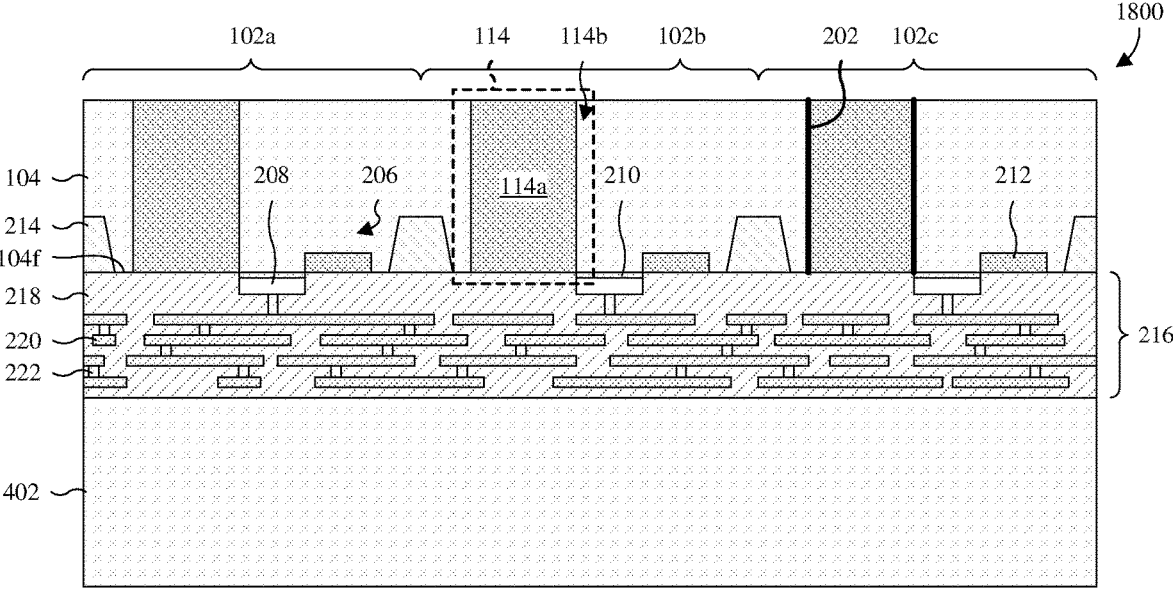

As illustrated by the cross-sectional view 1800 of FIG. 18, in some embodiments, the semiconductor substrate 104 is thinned. The thinning may, for example, be performed as described with regard to FIG. 10.

Figure 19:
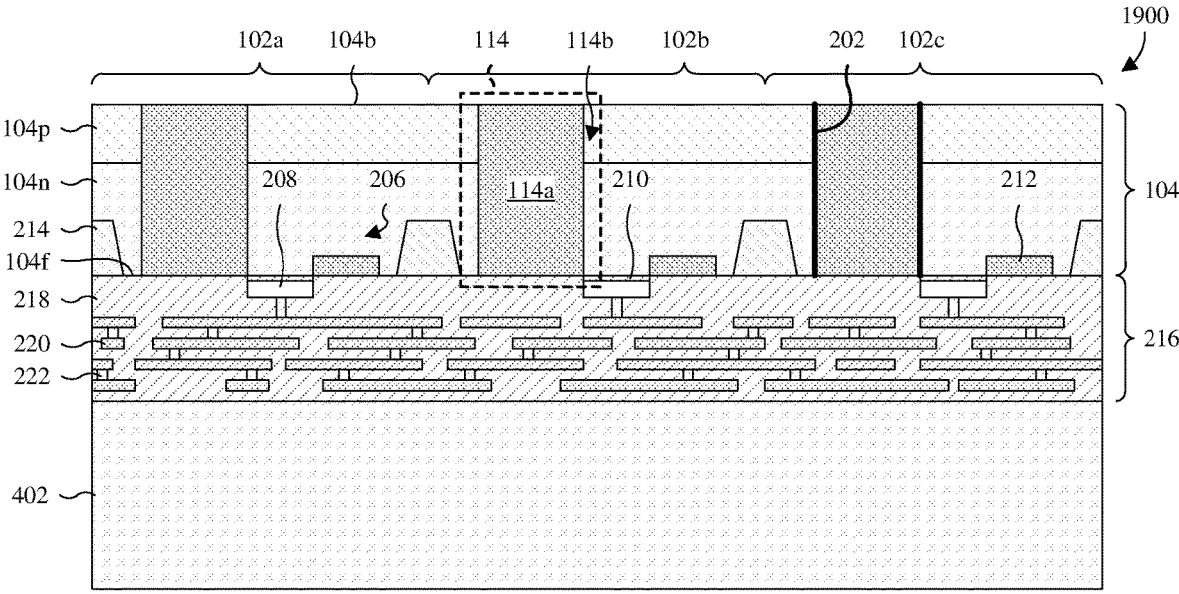

As illustrated by the cross-sectional view 1900 of FIG. 19, in some embodiments, an etch is performed into the semiconductor substrate 104 to divide the semiconductor substrate 104 into a non-porous semiconductor layer 104n and a porous semiconductor layer 104p. The porous semiconductor layer 104p is along the back-side surface 104b of the semiconductor substrate 104, and the non-porous semiconductor layer 104n is along the front-side surface of the semiconductor substrate 104. The porous semiconductor layer 104p may, for example, be formed as described with regard to FIG. 5.

Figure 20:
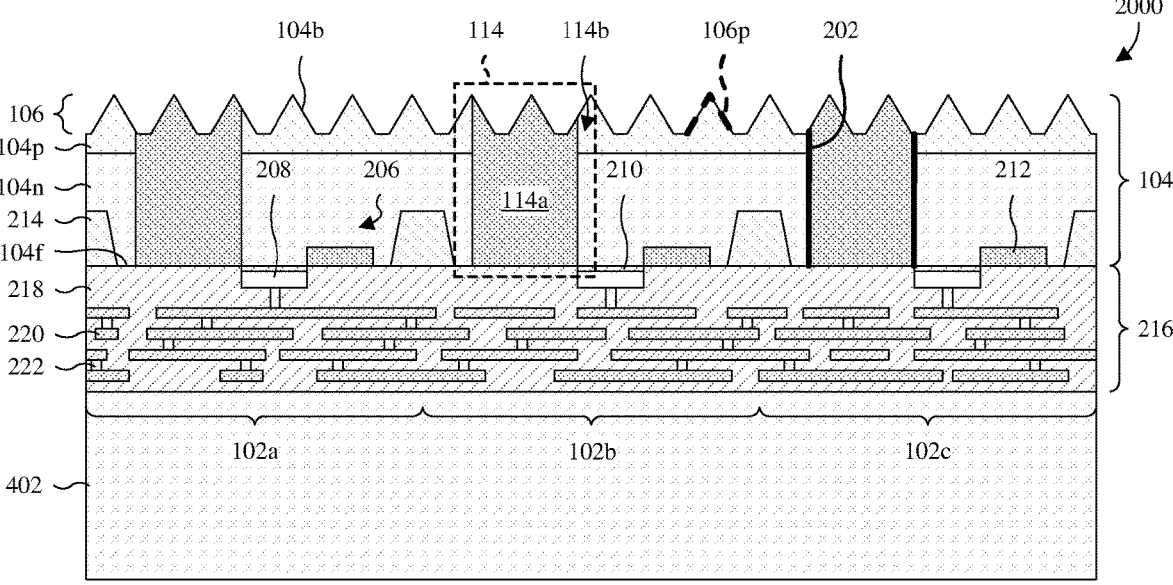

As illustrated by the cross-sectional view 2000 of FIG. 20, a periodic structure 106 is formed in the back-side surface 104b of the semiconductor substrate 104. The periodic structure 106 may, for example, be formed as described with regard to FIG. 6.

Figure 21:
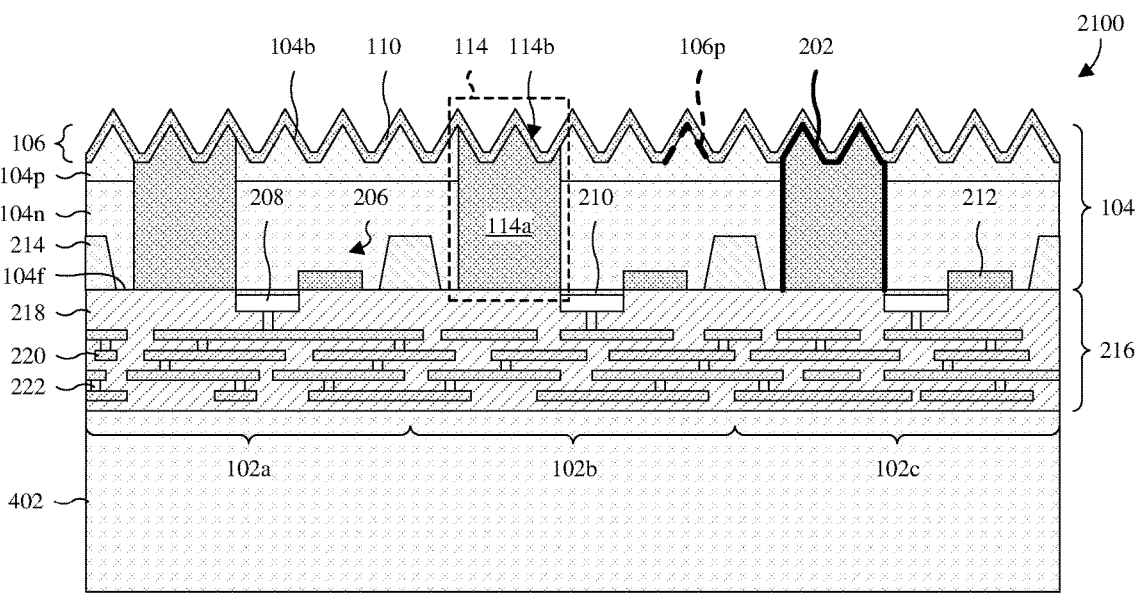

As illustrated by the cross-sectional view 2100 of FIG. 21, a high absorption layer 110 is formed lining the back-side surface 104b of the semiconductor substrate 104. The high absorption layer 110 may, for example, be formed as described with regard to FIG. 7.

Figure 22:
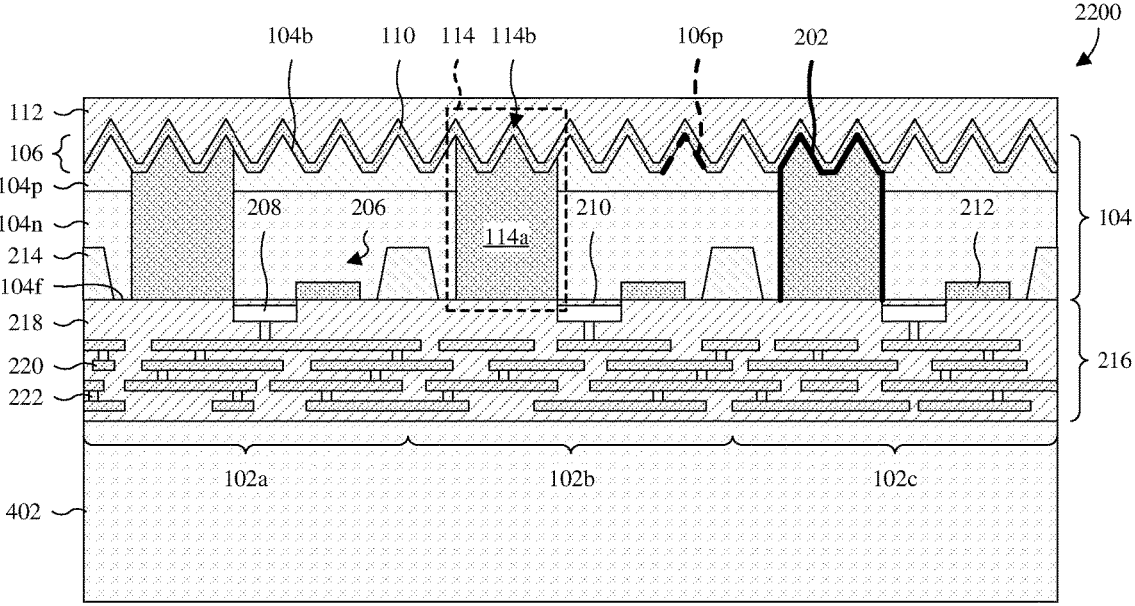

As illustrated by the cross-sectional view 2200 of FIG. 22, a passivation layer 112 is formed over the high absorption layer 110. The passivation layer 112 may, for example, be formed as described with regard to FIG. 8.

Figure 23:
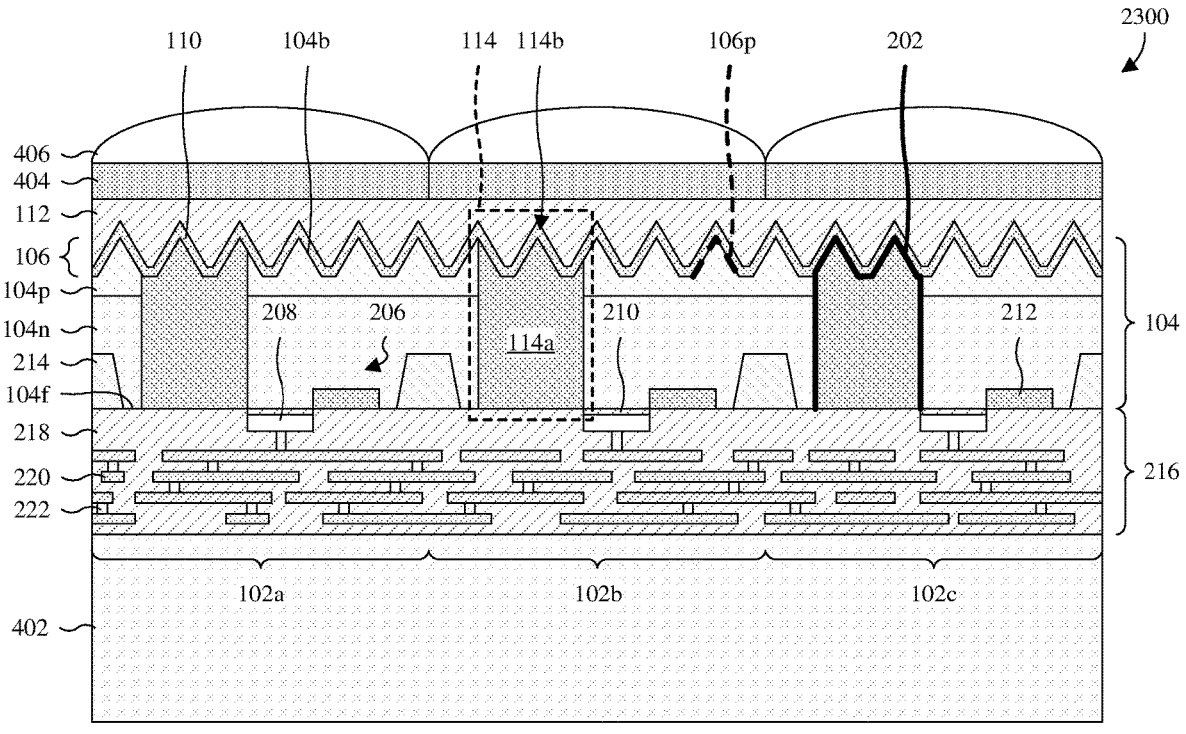

As illustrated by the cross-sectional view 2300 of FIG. 23, a plurality of color filters 404 are formed respectively over the high absorption pixel sensors 102a-102c. Further, a plurality of micro-lenses 406 are formed respectively over the color filters 404. The color filters 404 and/or the micro-lenses 406 may, for example, be formed as described with regard to FIG. 13.

With reference to FIG. 24, a flowchart 2400 of some embodiments of the method of FIGS. 15-23 is provided.

At 2402, a pixel sensor is formed on a front side of a semiconductor substrate, where the pixel sensor comprises a photodetector in the semiconductor substrate. See, for example, FIG. 15.

At 2404, an interconnect structure is formed covering the pixel sensor on the front side of the semiconductor substrate, where the interconnect structure comprises wiring layers and vias alternatingly stacked with the wiring layers. See, for example, FIG. 16.

At 2406, in some embodiments, a carrier substrate is bonded to the front side of the semiconductor substrate through the interconnect structure. See, for example, FIG. 17

At 2408, in some embodiments, the semiconductor substrate is thinned through a back side of the semiconductor substrate. See, for example, FIG. 18.

At 2410, in some embodiments, a first etch is performed into the back side of the semiconductor substrate to divide the semiconductor substrate into a porous semiconductor layer and a non-porous semiconductor layer. See, for example, FIG. 19.

At 2412, a second etch is performed into a back side of the semiconductor substrate to form a periodic structure along the back side of the semiconductor substrate. See, for example, FIG. 20.

At 2414, a high absorption layer is formed lining the back side of the semiconductor substrate. See, for example, FIG. 21.

At 2416, a passivation layer is formed covering the high absorption layer on the back side of the semiconductor substrate. See, for example, FIG. 22.

At 2418, a color filter and a micro-lens are formed stacked over the pixel on the front side of the semiconductor substrate. See, for example, FIG. 23.

While the flowchart 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide an image sensor. A semiconductor substrate includes a non-porous semiconductor layer. The non-porous semiconductor layer is along a front side of the semiconductor substrate. A periodic structure is along a back side of the semiconductor substrate. The periodic structure includes a plurality of protrusions defined by the semiconductor substrate. A high absorption layer lines the periodic structure on the back side of the semiconductor substrate. The high absorption layer is a semiconductor material with an energy bandgap less than that of the non-porous semiconductor layer. A photodetector is in the semiconductor substrate and the high absorption layer.

Further, other embodiments of the present application provide a method for manufacturing an image sensor. A semiconductor substrate is provided. The semiconductor substrate includes a non-porous semiconductor layer on a front side of the semiconductor substrate. An etch is performed into a back side of the semiconductor substrate to form a plurality of surface protrusions on the back side. The surface protrusions are formed in a periodic pattern, and the back side is opposite the front side. A high absorption layer is formed lining the plurality of surface protrusions on the back side of the semiconductor substrate. The high absorption layer is a semiconductor material with a lower energy bandgap than that of the non-porous semiconductor layer. A photodetector is formed in the semiconductor substrate and the high absorption layer.

Further yet, other embodiments of the present application provide an image sensor. A semiconductor substrate includes a non-porous semiconductor layer and a porous semiconductor layer. The non-porous semiconductor layer is along a front side of the semiconductor substrate. The porous semiconductor layer is along a back side of the semiconductor substrate that is opposite the front side. A high absorption layer lines the porous semiconductor layer on the back side of the semiconductor substrate. The high absorption layer has a higher absorption coefficient than the non-porous semiconductor layer. A photodetector includes a first doping-type region and a second doping-type region. The first doping-type region is in both the non-porous semiconductor layer and the porous semiconductor layer. The second doping-type region is in the high absorption layer and has an opposite doping type as the first doping-type region. The first and second doping-type regions interface to define a photo junction. A transfer transistor is on the front side of the semiconductor substrate. The transfer transistor includes a source/drain region, and the source/drain region is the first doping-type region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a substrate comprising a porous semiconductor layer along a bottom of the substrate;
a photodetector in the substrate; and
a semiconductor layer that lines and conforms to an uneven surface of the porous semiconductor layer at the bottom of the substrate.

2. The image sensor according to claim 1, wherein the porous semiconductor layer comprises a plurality of protrusions directly under the photodetector and protruding towards the semiconductor layer.

3. The image sensor according to claim 1, wherein the porous semiconductor layer comprises nanoporous silicon.

4. The image sensor according to claim 1, wherein the semiconductor layer directly contacts the porous semiconductor layer at a heterojunction.

5. The image sensor according to claim 4, wherein the porous semiconductor layer comprises a doped region of carbon along the heterojunction, and wherein a top boundary of the doped region and a bottom boundary of the doped region conform to the uneven surface from a first side of the photodetector to a second side of the photodetector opposite the first side.

6. The image sensor according to claim 1, wherein the substrate is silicon, and wherein the semiconductor layer comprises monocrystalline silicon doped with a chalcogen.

7. The image sensor according to claim 6, wherein the semiconductor layer is doped with the chalcogen in excess of a solubility limit of the chalcogen so the semiconductor layer is supersaturated with the chalcogen.

8. An image sensor, comprising:
a semiconductor substrate comprising a plurality of semiconductor protrusions on a bottom surface of the semiconductor substrate;
a semiconductor layer lining the plurality of semiconductor protrusions, wherein the semiconductor layer has a direct bandgap;
a photodetector in the semiconductor substrate; and
a transistor overlying the semiconductor substrate adjacent to the photodetector.

9. The image sensor according to claim 8, wherein the semiconductor substrate has an indirect bandgap at the transistor.

10. The image sensor according to claim 8, wherein the photodetector comprises a PN junction extending from a top of the semiconductor substrate towards the bottom surface of the semiconductor substrate.

11. The image sensor according to claim 8, further comprising:
a passivation layer underlying the semiconductor layer, and further having a surface that faces away from the semiconductor layer and that has a planar profile from a first side of the photodetector to a second side of the photodetector opposite the first side.

12. The image sensor according to claim 11, wherein the semiconductor layer directly contacts the passivation layer and the semiconductor substrate.

13. The image sensor according to claim 8, wherein the semiconductor layer has a top surface profile with a plurality of peaks and valleys.

14. An image sensor, comprising:
a semiconductor substrate;
a photodetector in the semiconductor substrate; and
a semiconductor layer underlying the semiconductor substrate, and further having a surface with a periodic profile from a first side of the photodetector to a second side of the photodetector opposite the first side;

wherein an energy bandgap of the semiconductor layer is less than about 1 electron volt (eV), and wherein an energy bandgap of the semiconductor substrate is greater than about 1 eV.

15. The image sensor according to claim 14, wherein the semiconductor substrate is monocrystalline silicon, and wherein the semiconductor layer is silicon germanium.

16. The image sensor according to claim 14, wherein the semiconductor substrate is entirely over the semiconductor layer.

17. The image sensor according to claim 14, wherein the surface of the first semiconductor layer faces the semiconductor substrate.

18. The image sensor according to claim 14, wherein the periodic profile has a plurality of peaks and a plurality of valleys that alternate from the first side of the photodetector to the second side of the photodetector.

19. The image sensor according to claim 14, further comprising:

an interconnect structure overlying the semiconductor substrate and comprising a plurality of wires and a plurality of vias that are alternatingly stacked.

20. The image sensor according to claim 14, wherein the semiconductor substrate comprises a bottom surface facing the semiconductor layer and having an additional periodic profile, and wherein the additional periodic profile has a plurality of peaks and a plurality of valleys that alternate.

* * * * *